US011818813B2

(12) United States Patent
Kawanabe et al.

(10) Patent No.: US 11,818,813 B2
(45) Date of Patent: Nov. 14, 2023

(54) WAFER-USE MEMBER, WAFER-USE SYSTEM, AND METHOD FOR MANUFACTURING WAFER-USE MEMBER

(71) Applicant: KYOCERA Corporation, Kyoto (JP)

(72) Inventors: Yasunori Kawanabe, Kirishima (JP); Yoshihiro Okawa, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 290 days.

(21) Appl. No.: 17/278,355

(22) PCT Filed: Sep. 25, 2019

(86) PCT No.: PCT/JP2019/037532
§ 371 (c)(1),
(2) Date: Mar. 22, 2021

(87) PCT Pub. No.: WO2020/067129
PCT Pub. Date: Apr. 2, 2020

(65) Prior Publication Data
US 2021/0352771 A1    Nov. 11, 2021

(30) Foreign Application Priority Data
Sep. 28, 2018   (JP) ................................ 2018-183969

(51) Int. Cl.
*H05B 3/26*    (2006.01)
*H01L 21/67*    (2006.01)
(Continued)

(52) U.S. Cl.
CPC ............. *H05B 3/265* (2013.01); *B28B 23/00* (2013.01); *H05B 1/0233* (2013.01);
(Continued)

(58) Field of Classification Search
CPC .............. B28B 23/00; H01L 21/67103; H01L 21/68785; H01L 21/68792; H05B 1/0233;
(Continued)

(56) References Cited

U.S. PATENT DOCUMENTS 5,560,851 A * 10/1996 Thimm ................. H05B 3/283
                                                          219/544
6,558,508 B1    5/2003   Kawakami
(Continued)

FOREIGN PATENT DOCUMENTS

JP    H11-265931 A    9/1999
JP    2003-160874 A    6/2003
(Continued)

*Primary Examiner* — Sang Y Paik
(74) *Attorney, Agent, or Firm* — Procopio, Cory, Hargreaves & Savitch LLP

(57) ABSTRACT

A heater includes a plate-shaped part, one or more resistance heating element, a columnar part, and a plurality of relay conductors. The plate-shaped part has an insulation property and includes an upper surface on which a wafer is to be superimposed and a lower surface on an opposite side to the upper surface. The one or more resistance heating element is buried in the plate-shaped part. The columnar part has an insulation property and projects downward from the lower surface of the plate-shaped part. The plurality of relay conductors respectively include extension portions vertically extending inside the columnar part and are electrically connected to the one or more resistance heating elements.

18 Claims, 15 Drawing Sheets

(51) Int. Cl.
*B28B 23/00* (2006.01)
*H05B 1/02* (2006.01)

(52) U.S. Cl.
CPC .. *H01L 21/67103* (2013.01); *H05B 2203/002* (2013.01); *H05B 2203/016* (2013.01); *H05B 2203/017* (2013.01)

(58) Field of Classification Search
CPC ........ H05B 2203/002; H05B 2203/003; H05B 2203/016; H05B 2203/017; H05B 3/265; H05B 3/283; H05B 3/74
USPC .......................................... 219/443.1–444.1
See application file for complete search history.

(56) References Cited

U.S. PATENT DOCUMENTS

| | | | |
|---|---|---|---|
| 2003/0066608 A1 | 4/2003 | Natsuhara et al. | |
| 2003/0089600 A1 | 5/2003 | Natsuhara et al. | |
| 2004/0175549 A1* | 9/2004 | Ito | C04B 35/5611 428/209 |
| 2005/0173410 A1 | 8/2005 | Okajima et al. | |
| 2005/0210974 A1* | 9/2005 | Unno | H01L 21/67103 73/204.26 |
| 2005/0211691 A1* | 9/2005 | Unno | H01L 21/67103 219/216 |
| 2013/0248509 A1* | 9/2013 | Unno | H05B 1/0233 219/521 |
| 2017/0127475 A1* | 5/2017 | Nagai | H05B 3/06 |
| 2018/0204754 A1 | 7/2018 | Tokusho et al. | |

FOREIGN PATENT DOCUMENTS

| | | |
|---|---|---|
| JP | 2005-166354 A | 6/2005 |
| JP | 2006-186351 A | 7/2006 |
| JP | 2011-243881 A | 12/2011 |
| JP | 2017-092337 A | 5/2017 |
| WO | 2017/154435 A1 | 9/2017 |

* cited by examiner

Gr

Gr

WAFER-USE MEMBER, WAFER-USE SYSTEM, AND METHOD FOR MANUFACTURING WAFER-USE MEMBER

TECHNICAL FIELD

The present disclosure relates to a wafer-use member, a wafer-use system, and a method for manufacturing the wafer-use member.

BACKGROUND ART

Known in the art is a wafer-use member on the upper surface of which a wafer is superimposed (for example Patent Literature 1 or 2). Such a wafer-use member has a plate-shaped base body made of ceramic and an internal conductor positioned in an internal portion of that. Further, the wafer-use member, for example, by application of voltage to the internal conductor, exerts a function of heating the wafer, a function of picking up the wafer by suction, a function of generating plasma around the wafer, or a combination of two or more of these functions. Such a wafer-use member is for example used in a semiconductor manufacturing apparatus.

Patent Literatures 1 and 2 disclose ceramic heaters having plate-shaped base bodies explained above and tubular members which extend downward from the base bodies. In a region surrounded by the tubular member in a lower surface of the base body, terminals connected to the internal conductor in the base body are exposed. Wirings inserted through the tubular member are connected to the terminals. The tubular member contributes to support of the base body and contributes to protection of the terminals and wirings.

CITATIONS LIST

Patent Literature

Patent Literature 1: Japanese Patent Publication No. 2003-160874
Patent Literature 2: Japanese Patent Publication No. 2005-166354

SUMMARY OF INVENTION

A wafer-use member according to one aspect of the present disclosure includes an insulating plate-shaped part, one or more internal conductors, an insulating columnar part, and a plurality of relay conductors. The plate-shaped part includes an upper surface on which a wafer is to be superimposed and a lower surface on an opposite side to the upper surface. The one or more internal conductors are buried in the plate-shaped part. The columnar part projects downward from the lower surface of the plate-shaped part. The plurality of relay conductors respectively include extension portions vertically extending inside the columnar part and are electrically connected to the one or more internal conductors.

A wafer-use system according to one aspect of the present disclosure includes the wafer-use member described above, a power supply part which supplies power to the relay conductors part, and a control part which controls the power supply part.

A method for manufacturing the wafer-use member according to one aspect of the present disclosure includes a step of preparing a first shaped member including the columnar part by using a ceramic material, a step of inserting the relay conductor into the first shaped member, a step of obtaining a sintered body by firing the first shaped member in which the relay conductor was inserted, a step of preparing a second shaped member which includes a shape of the plate-shaped part with a recessed portion in a lower surface and in which a conductive paste forming the internal conductor is buried by using a ceramic material, and a step of obtaining a joined member by inserting a portion of the sintered body into the recessed portion in the second shaped member and then firing the assembly.

A method for manufacturing the wafer-use member according to one aspect of the present disclosure includes a step of preparing a first shaped member including the columnar part by using a ceramic material, a step of inserting the relay conductor into the first shaped member, a step obtaining a first sintered body by firing the first shaped member in which the relay conductor was inserted, a step preparing a second shaped member which includes a shape of the plate-shaped part with a recessed portion in a lower surface and in which a conductive paste forming the internal conductor is buried by using a ceramic material, a step of obtaining a second sintered body by firing the second shaped member, and a step of obtaining a joined member by inserting a portion of the first sintered body into the recessed portion in the second sintered body and joining the two.

DESCRIPTION OF EMBODIMENTS

Figure 1A:
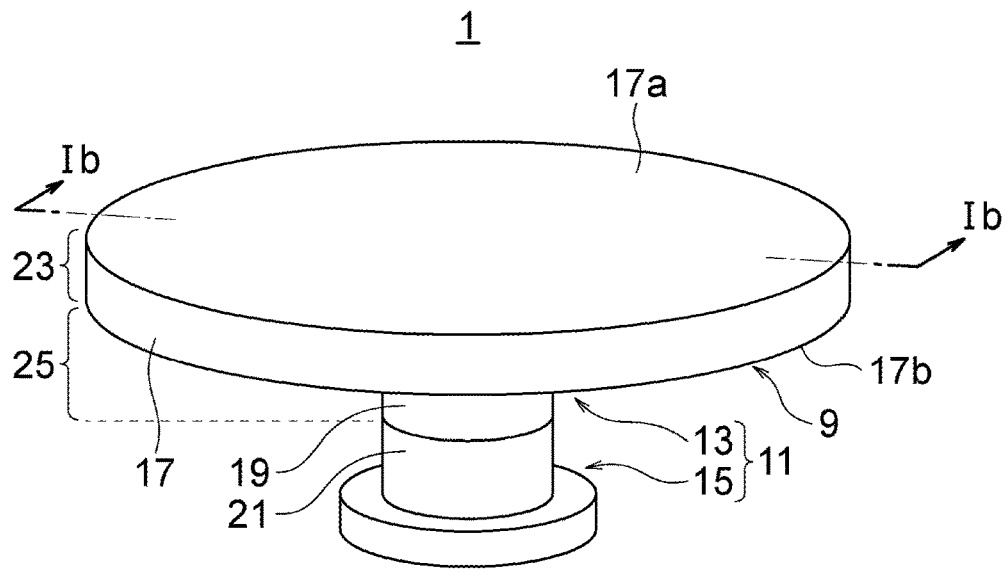
FIG. 1A is a schematic perspective view showing the configuration of a heater according to an embodiment.

Below, wafer-use members in the present disclosure will be explained by taking ceramic heaters as examples. The drawings which will be referred to below are schematic ones for convenience of explanation. Accordingly, sometimes details will be omitted. Further, size ratios will not always coincide with the actual ones. Further, the heaters may be further provided with known components which are not shown in the drawings as well.

In the second and following embodiments, basically only differences from those in the previously explained embodiments will be explained. Matters which are not particularly referred to may be considered the same as those in the previously explained embodiments. Further, for convenience of explanation, for the configurations corresponding to each other among the plurality of embodiments, sometimes the same notations will be attached even if there are differences.

First Embodiment (Heater System)

Figure 1B:
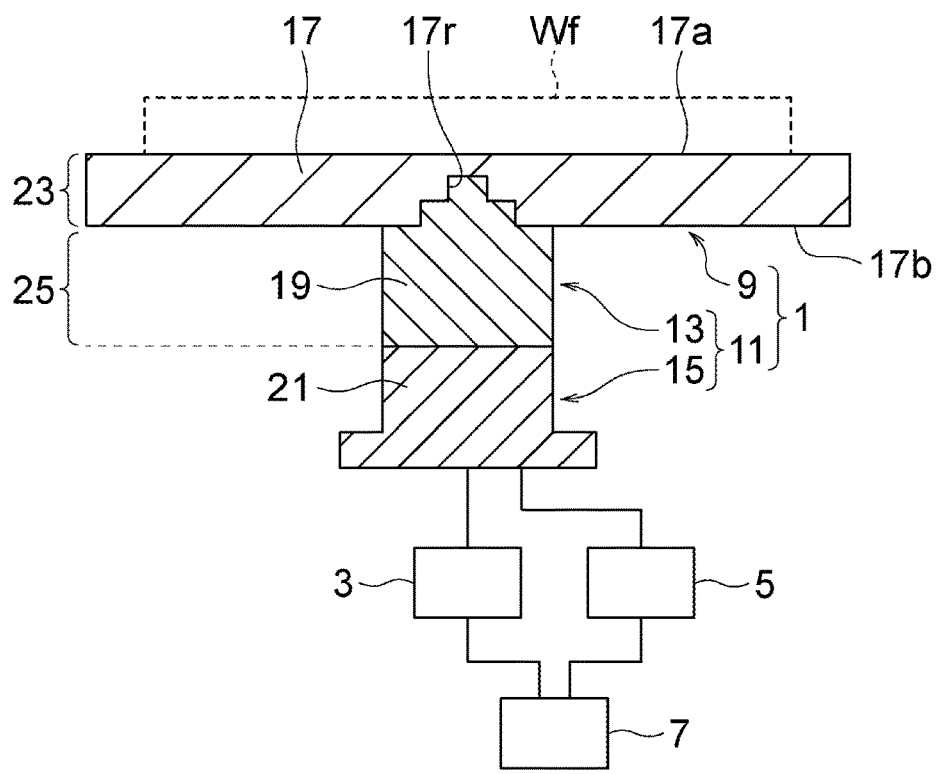
FIG. 1B is a cross-sectional view taken along the Ia-Ia line in FIG. 1A.

FIG. 1A is a schematic disassembled perspective view showing the configuration of a heater 1 according to a first embodiment. FIG. 1B is a schematic view showing the configuration of a heater system 101 including the heater 1 in FIG. 1A. In FIG. 1B, for the heater 1, a cross-sectional view along the Ib-Ib line in FIG. 1A is shown.

Upward in the drawing sheets in FIG. 1A and FIG. 1B is for example vertically upward. However, the heater 1 need not utilize upward in the drawing sheets in FIG. 1A and FIG. 1B as vertically upward. In the following explanation, for convenience, sometimes the "upper surface" and "lower surface" and other terms will be used where the upper directions of the drawing sheets in FIG. 1A and FIG. 1B are vertically upward. When simply referring to "when viewed on a plane", unless particularly explained, it designates viewed from upward in the drawing sheets in FIG. 1A and FIG. 1B.

The heater system 101 for example has a heater 1, a power supply part 3 which supplies power to the heater 1, a fluid supply part which supplies fluid to the heater 1, and a control part 7 which controls the power supply part 3 and fluid supply part 5. The fluid is for example a coolant for cooling the heater 1 and/or purge gas which replaces a process gas. The fluid may be a gas or may be a liquid.

(Heater)

The heater 1 for example has a substantially plate-shaped (disk-shaped in the example shown) heater plate 9 and a heater pillar 11 which projects downward from the heater plate 9. The heater pillar 11 is for example configured by an upper pillar 13 which is fixed to the lower surface of the heater plate 9 and a lower pillar 15 which is fixed to the lower end of the upper pillar 13.

The heater plate 9 has a wafer Wf (FIG. 1B) placed (superimposed) on an upper surface 17a of the plate as one example of a heated object and directly contributes to heating of the wafer. The heater pillar 11 for example contributes to support of the heater plate 9 and mediation between the heater plate 9 and the power supply part 3. The heater pillar 11 is for example able to be transported in a divided state due to its being configured by the upper pillar 13 and lower pillar 15.

The heater plate 9 has an insulating plate-shaped body 17 and an internal conductor (explained later) which is positioned inside the plate-shaped body 17. The upper pillar 13 has an insulating columnar body 19 and relay conductors (explained later) which are positioned inside the columnar body 19. The lower pillar 15 has an insulating lower base body 21 and lower conductors (explained later) positioned inside the lower base body 21.

The upper end side portion of the columnar body 19 is inserted in a recessed portion 17r formed in the lower surface 17b of the plate-shaped body 17. The portion in the columnar body 19 which is inserted in the recessed portion 17r and the plate-shaped body 17 will be called a "plate-shaped part 23" together. Further, the portion of the columnar body 19 which is positioned lower than the lower surface 17b of the plate-shaped body 17 will be called the "columnar part 25."

The plate-shaped body 17 and the columnar body 19 are for example separately formed in their shapes and are joined with each other. However, as will be explained later, the boundary between the plate-shaped body 17 and the columnar body 19 sometimes becomes unclear or disappears after completion of the heater 1 depending on the materials of these members and the manufacturing method of the heater 1. When considering such a case, the concept of the plate-shaped part 23 and the columnar part 25 dividing the heater 1 based on the outer appearance of the heater 1 is useful.

(Heater Plate)

The upper surface 17a and lower surface 17b of the heater plate 9 are for example substantially planar. The planar shape and various dimensions of the heater plate 9 may be suitably set considering the shape and dimensions etc. of the heated object. For example, the planar shape is circular (example shown) or polygonal (for example rectangular). If showing one example of the dimensions, the diameter is 20 cm to 35 cm and the thickness is 4 mm to 30 mm.

Figure 2:
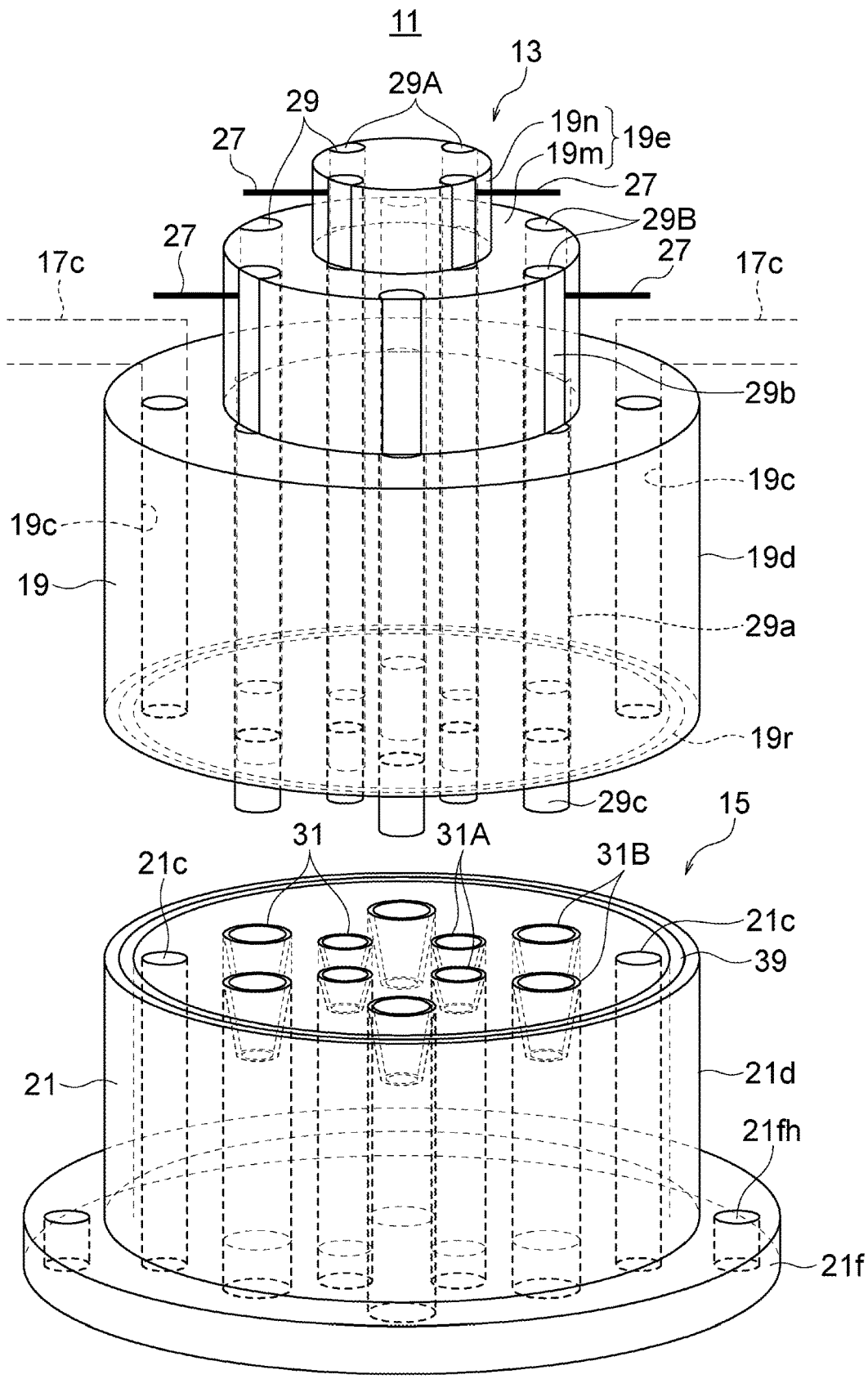
FIG. 2 is a disassembled perspective view of a heater pillar in the heater in FIG. 1A.

The heater plate 9, for example, has a resistance heating element 27 (a portion thereof is schematically shown in FIG. 2) as the internal conductor buried inside the plate-shaped body 17. By current running in the resistance heating element 27, heat is generated according to Joule's law. In turn, the wafer placed on the upper surface 17a of the plate-shaped body 17 is heated.

(Plate-Shaped Body)

The outer shape of the plate-shaped body 17 configures the outer shape of the heater plate 9. Accordingly, an explanation according to the shape and dimensions of the heater plate 9 explained above may be grasped as an explanation of the outer shape and dimensions of the plate-shaped body 17 as it is. The material of the plate-shaped body 17 is for example ceramic. The ceramic is for example a sintered body containing aluminum nitride (AlN), aluminum oxide ($Al_2O_3$, alumina), silicon carbide (SiC), silicon nitride ($Si_3N_4$), or the like as the principal constituent. Note that, the principal constituent is for example a constituent accounting for 50 mass % or more or 80 mass % or more of the material (same is true for the following explanation).

(Resistance Heating Element)

The resistance heating element 27 (see FIG. 2) extends along (for example parallel to) the upper surface 17a and lower surface 17b of the plate-shaped body 17. Further, the resistance heating element 27, when viewed on a plane, for example, extends covering over substantially the entire surface of the plate-shaped body 17. In the internal portion of the plate-shaped body 17, a single layer of a resistance heating element 27 may be provided or two or more layers of resistance heating elements 27 may be provided. In other words, the resistance heating element 27 may be provided at only one position in the vertical direction or may be provided at two or more positions in the vertical direction. In the present embodiment, an aspect where two layers of resistance heating elements 27 are provided will be taken as an example.

The specific pattern (route) of the resistance heating element 27 when viewed on a plane may be made a suitable one. For example, in one layer provided with the resistance heating element 27, the resistance heating element 27 extends from its one end to the other end without crossing itself. Further, the resistance heating element 27, when viewed on a plane, may spirally extend, may extend so as to move back and forth (in meandering state) in a circumferential direction, or may extend so as to linearly move back and forth. Further, such a pattern may span substantially the entire surface of the heater plate 9 or may be provided for each of the regions obtained by dividing the heater plate 9 into a plurality of sections.

The shape when locally viewing the resistance heating element 27 may be made a suitable one. For example, the resistance heating element 27 may be a layered conductor which is parallel to the upper surface 17a and lower surface 17b, may be coil shaped (spring shaped) wound using the above route as the axis, or may be formed in a mesh shape. Also, the dimensions in the various shapes may be suitably set.

The material of the resistance heating element 27 is a conductor (for example metal) which generates heat by flow of current. The conductor may be suitably selected. For example, it is tungsten (W), molybdenum (Mo), platinum (Pt), indium (In), or an alloy containing them as principal constituents. Further, the material of the resistance heating element 27 may be one obtained by firing a conductive paste including the metal as described before as well. That is, the material of the resistance heating element 27 may be one containing glass powder and/or ceramic powder or another additive (from another viewpoint, an inorganic insulating material).

(Heater Pillar)

FIG. 2 is a disassembled perspective view of the heater pillar 11. Note that, the heater pillar 11 may be able to be disassembled as illustrated according to need even after the upper pillar 13 and the lower pillar 15 are once fastened or may be unable to be disassembled as illustrated (without breakage) after they are once fastened.

The upper pillar 13 has relay conductors 29 (29A and 29B) for electrically connecting the resistance heating element 27 and an exterior of the heater 1. The relay conductors 29 vertically extend inside the columnar body 19. In the relay conductors 29, the upper side portions are connected to the resistance heating element 27, and the lower ends are exposed from the lower side portions. The lower pillar 15 has a plurality of lower conductors 31 which vertically extend inside the lower base body 21. The lower conductors 31 have upper ends which are connected to the lower ends of the relay conductors 29 and have lower ends which are exposed from the lower side portion of the lower base body 21. Due to this, in the heater 1, it becomes possible to supply power from the lower side portion of the heater pillar 11 through the heater pillar 11 to the resistance heating element 27.

The columnar body 19 has upper channels 19c which open in the upper side portion of the columnar body 19 and which open also in the lower side portion. The upper side openings of the upper channels 19c are linked with plate channels 17c provided in the plate-shaped body 17. Further, the lower base body 21 has lower channels 21c which open in the upper side portion of the lower base body 21 and open in the lower side portion. The upper side openings of the lower channels 21c are linked with lower side openings of the upper channels 19c. Due to this, in the heater 1, it becomes possible to supply a fluid from the lower side portion in the heater pillar 11 through the heater pillar 11 to the plate channels 17c.

(Columnar Body)

The columnar body 19, for example, is basically (excluding the upper channels 19c etc.) a solid member. "Solid" means that no spaces having gas or evacuated are formed. For example, within an upper side (plate-shaped body 17 side) range of ⅓ or more, ½ or more, or ⅔ or more of the columnar body 19 (or columnar part 25), 100% or 80% or more of volumes of the columnar body 19 (or columnar part 25) excluding the capacities of the channels and the volumes of the conductors is solid. The shape and dimensions of the columnar body 19 may be suitably set. In the columnar body 19 (or columnar part 25), the length in the vertical direction may be larger than, equal to, or smaller than the diameter (for example, the maximum diameter when not circular when viewed on a plane). In other words, the columnar body 19 (columnar part 25) need not be shaped elongated up and down.

The columnar body 19 for example has a column main body 19d forming the columnar part 25 and a projecting portion 19e which projects from the upper surface of the column main body 19d. The projecting portion 19e is the portion which is inserted in the recessed portion 17r of the plate-shaped body 17 and configures the plate-shaped part 23 together with the plate-shaped body 17. The projecting portion 19e has a large-diameter portion 19m which directly projects from the upper surface of the column main body 19d and a small-diameter portion 19n which projects from the upper surface of the large-diameter portion 19m. Note that, in the explanation of the present embodiment, when referring to the "upper surface of the projecting portion 19e", it designates the upper surface of the small-diameter portion 19n and/or upper surface of the large-diameter portion 19m. In the same way, when referring to the "side surface of the projecting portion 19e", it designates the side surface of the small-diameter portion 19n and/or side surface of the large-diameter portion 19m.

The respective shapes of the column main body 19d, large-diameter portion 19m, and small-diameter portion 19n (projecting portions 19e) may be suitably set. For example, the shapes of the transverse cross-sections (horizontal cross-sections) may be made circular (example shown) or polygonal or other suitable shapes. Further, for example, the column main body 19d, large-diameter portion 19m, and small-diameter portion 19n, when viewed on a plane, may coincide in their centers (example shown) or may not coincide. Further, the shapes and areas of the column main body 19d, large-diameter portion 19m, and small-diameter portion 19n in their transverse cross-sections may be constant (example shown) or may change in the vertical direction. Further, for example, one of a key groove and key for positioning the plate-shaped body 17 and the columnar body 19 around the vertical axis may be formed in the projecting portion 19e, and the other may be formed in the recessed portion 17r.

Note that, in the present disclosure, when referring to the "center when viewed on a plane", unless indicated otherwise, it designates the geometric center (centroid) of the figure formed by the outer edge of the member when viewed on a plane. When explaining this for confirmation, the geometric center is the point where the primary moment around that becomes zero. Accordingly, for example, the center can be defined even in a shape other than a circle or rotationally symmetrical shape. Further, the center may be rationally identified ignoring any singular portion at the outer edge of the member (for example the key groove or key described above or for example a portion of 10% or less or 5% or less of the area of the transverse cross-section).

The various dimensions of the columnar body 19 may also be suitably set. For example, the diameter of the column main body 19*d* (the maximum diameter when not circular) may be made for example 1/20 or more, 1/10 or more, or 1/5 or more of the diameter of the plate-shaped body 17 (the maximum diameter when not circular). Further, the former diameter may be made 2/3 or less, 1/2 or less, 1/3 or less, or 1/5 or less of the later diameter. The lower limits and upper limits may be suitably combined unless they are contradictory. Further, for example, the diameter of the column main body 19*d* (the maximum diameter when not circular) may be made 20 mm or more, 30 mm or more, or 40 mm or more. Further, the above diameter may be made 70 mm or less, 60 mm or less, or 50 mm or less. The above lower limits and upper limits may be suitably combined. Further, for example, the length of the column main body 19*d* in the vertical direction may be made 1/10 or more, 1/2 or more, 2 times or more, 5 times or more, or 10 times or more of the thickness of the plate-shaped body 17. Further, for example, the above length may be made 20 times or less, 10 times or less, 5 times or less, 2 times or less, or 1/2 or less of the above thickness. The above lower limits and upper limits may be suitably combined unless they are contradictory. Further, for example, the length of the column main body 19*d* in the vertical direction may be made 10 mm or more, 20 mm or more, or 30 mm or more. Further, the above length may be made 300 mm or less, 200 mm or less, or 100 mm or less. The above lower limits and upper limits may be suitably combined.

Further, for example, the diameter of the projecting portion 19*e* (diameter of the small-diameter portion 19*n* or diameter of the large-diameter portion 19*m*, the maximum diameter when not circular) may be made 1/10 or more, 1/5 or more, 1/3 or more, or 1/2 or more of the diameter of the column main body 19*d* (the maximum diameter when not circular). Further, the former diameter may be made 2/3 or less, 1/2 or less, 1/3 or less, or 1/5 or less of the later diameter. The above lower limits and upper limits may be suitably combined unless they are contradictory. Further, for example, the height of the projecting portion 19*e*, for example, may be made 1/10 or more, 1/5 or more, 1/3 or more, or 1/2 or more of the thickness of the plate-shaped body 17. Further, the above height may be made 4/5 or less, 2/3 or less, 1/3 or less, or 1/5 or less of the above thickness. The above lower limits and upper limits may be suitably combined unless they are contradictory. Further, for example, the height of the projecting portion 19*e* (depth of the recessed portion 17*r*) may be made 3 mm or more or 8 mm or more. Further, the above height may be made 15 mm or less or 10 mm or less. The above lower limits and upper limits may be suitably combined.

The material of the columnar body 19 is for example ceramic. As the specific material of ceramic, for example, one explained in the explanation of the plate-shaped body 17 (AlN or the like) may be utilized. Further, the material of the columnar body 19 may be the same as or different from the material of the plate-shaped body 17. In a case where the material of the columnar body 19 is different from the material of the plate-shaped body 17, the principal constituents of the two may be the same or may be different.

(Relay Conductors)

The pluralities of relay conductors 29 (29A and 29B) are for example configured by metals linearly extending in parallel to the vertical direction inside the columnar body 19. However, for example, the relay conductors 29 may bend in the middle, may have portions extending in the horizontal direction in the middle, or may extend with inclinations relative to the vertical direction. When viewing the entireties of the portions of the relay conductors 29 which are positioned inside the columnar body 19 (or columnar part 25), if the sides connected to the lower pillar 15 (from another viewpoint, power supply part 3) are positioned lower (on sides away from the plate-shaped part 23) relative to the sides connected to the resistance heating elements 27, the relay conductors 29 may be grasped as extending in the vertical direction inside the columnar body 19 (or columnar part 25).

The pluralities of relay conductors 29 (29A and 29B) are exposed from the columnar body 19 at the upper side from the upper surface of the column main body 19*d* (including the upper surface of the column main body 19*d*). Due to this, it becomes possible to connect the relay conductors 29 to the resistance heating elements 27. More specifically, in the example shown, the relay conductors 29 are exposed at the side surface and upper surface of the projecting portion 19*e*, and the resistance heating elements 27 are connected to these exposed portions. From another viewpoint, the relay conductors 29 have extension portions 29*a* which vertically extend inside the column main body 19*d* (columnar part 25) and connection portions 29*b* which extend from the extension portions 29*a* to the interior of the projecting portion 19*e* (portion of the plate-shaped part 23), and the connection portions 29*b* are connected to the resistance heating elements 27.

In further detail, the plurality of relay conductors 29 for example include relay conductors 29A which pass through the column main body 19*d*, large-diameter portion 19*m*, and small-diameter portion 19*n* and relay conductors 29B which pass through the column main body 19*d* and large-diameter portion 19*m* (do not pass through the small-diameter portion 19*n*). When viewed on a plane, the small-diameter portion 19*n* is held inside the large-diameter portion 19*m*, therefore the plurality of relay conductors 29A are positioned on the inner side of the plurality of relay conductors 29B (from another viewpoint, the side closer to the center of the columnar part 25 when viewed on a plane). The relay conductors 29A are exposed at the upper surface and side surface of the small-diameter portion 19*n*. The relay conductors 29B are exposed at the upper surface and side surface of the large-diameter portion 19*m*.

From another viewpoint, compared with the relay conductors 29A, the relay conductors 29B, when viewed on a plane, are set away from the center of the columnar part 25 and have upper ends which are positioned lower than the relay conductors 29A (side away from the internal conductor). Further, the relay conductors 29A and 29B respectively have connection portions 29*b* which extend from the extension portions 29*a* to the interior of the plate-shaped part 23 (interior of the projecting portion 19*e*). The connection portions 29*b* of the relay conductors 29B, compared with the connection portions 29*b* of the relay conductors 29A, are set away from the center of the columnar part 25 when viewed on a plane and are shorter in lengths from the lower surface 17b of the plate-shaped part 23 to an upper part (side closer to the internal conductor).

As already explained, in the present embodiment, two layers of resistance heating elements 27 are provided. The connection portions 29b of the relay conductors 29A are connected to the upper side layer of the resistance heating elements 27. The connection portions 29b of the relay conductors 29B are connected to the lower side layer of the resistance heating elements 27. In other words, the relay conductors 29A and 29B are respectively connected to single layers of the resistance heating elements 27. Note that, the connection portions 29b are exposed over certain extents of lengths in the vertical direction. Accordingly, although not particularly shown, it is also possible to connect two or more layers of resistance heating elements 27 to mutually different positions of one connection portion 29b in the vertical direction.

Further, the pluralities of relay conductors 29 are exposed from the lower side portion of the column main body 19d (columnar part 25). The lower side portion is for example a lower side half of the column main body 19d. Further, from another viewpoint, the pluralities of relay conductors 29 are exposed at the surface of the column main body 19d in a region concealed from the external portion by the lower pillar 15 (lower base body 21). In the example shown, the relay conductors 29 are exposed from the lower surface of the column main body 19d. That is, the relay conductors 29 have projecting portions 29c which extend downward from the extension portions 29a and project from the lower surface of the columnar part 25.

Note that, although not particularly shown, the relay conductors 29 may be positioned on the side closer to the center of the projecting portion 19e than the example shown when viewed on a plane and may be exposed only from the upper surface of the projecting portion 19e. Further, the relay conductors 29 may be made lower in the positions of the upper ends than those in the example shown and may be exposed only from the side surface of the projecting portion 19e (19n or 19m). As already explained, the relay conductors 29 may bend and the like. Accordingly, for example, it is also possible to make the relay conductors 29 bend on the upper end side and be exposed only from the side surface of the projecting portion 19e or make the relay conductors 29 bend on the lower end side and be exposed from the side surface of the lower side portion in the column main body 19d. Further, the lower ends of the relay conductors 29 need not project from the surface of the column main body 19d and may be exposed at positions deeper than the surface of the column main body 19d.

Figure 3A:
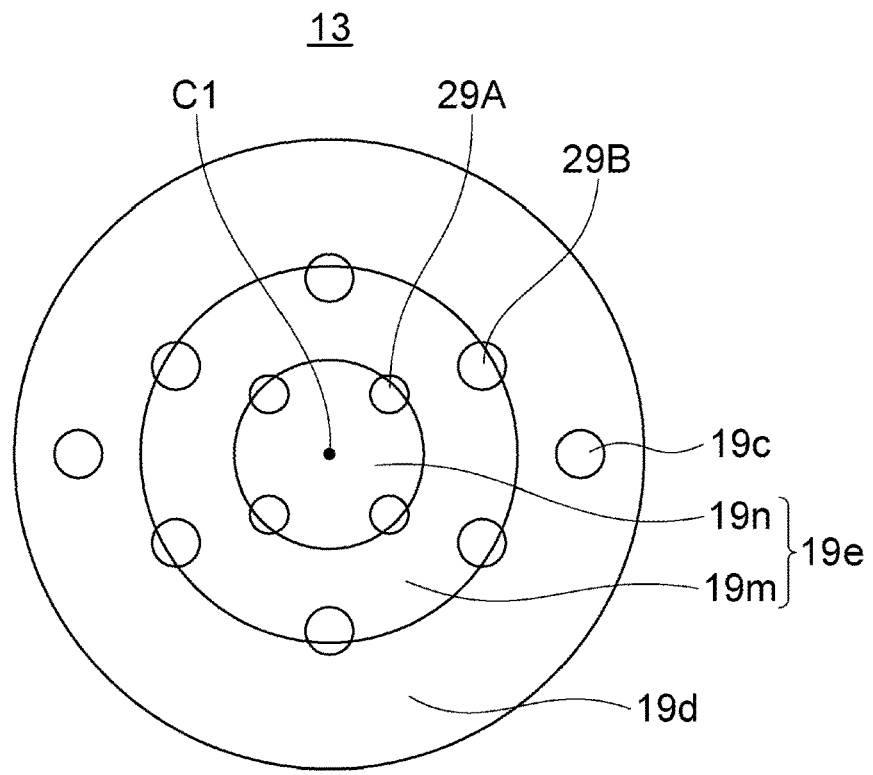
FIG. 3A and FIG. 3B are a top view and bottom view of an upper pillar in the heater pillar in FIG. 2.
Figure 3B:
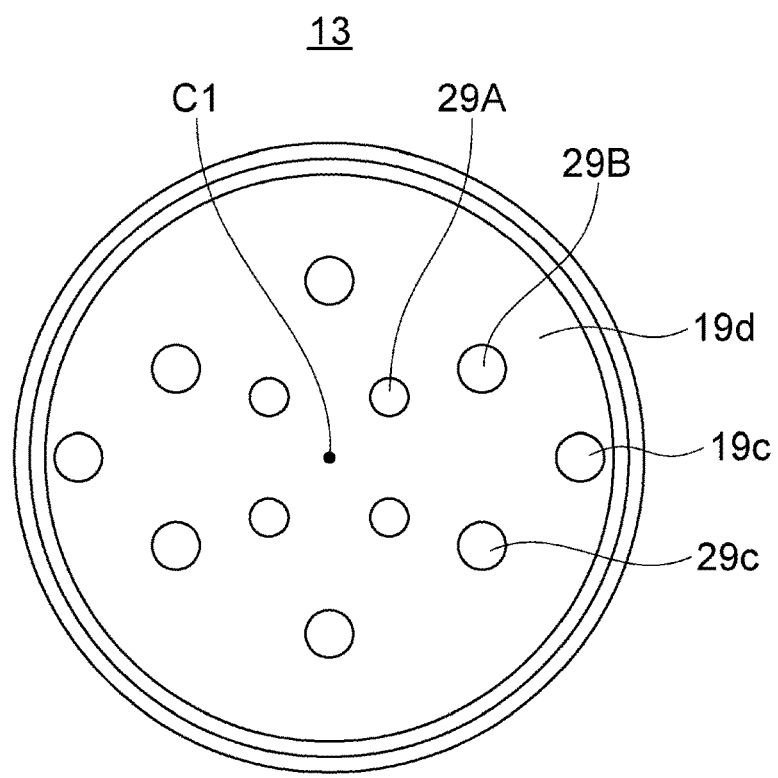

FIG. 3A is a top view of an upper pillar 13. FIG. 3B is a bottom view of the upper pillar 13.

The plurality of relay conductors 29A are for example arranged on the same circumference having the center C1 of the column main body 19d (columnar part 25) as the center side when viewed on a plane. In the example shown, the center of the circumference on which the relay conductors 29A are arranged coincides with the center C1 of the column main body 19d. Further, the plurality of relay conductors 29A are for example arranged point symmetrically (rotation symmetrical by 180°) relative to the center of the circumference (center C1). Further, for example, the relay conductors 29A are arranged on the circumference with an equal pitch. From another viewpoint, where "n" is an integer of 2 or more, "n" number of relay conductors 29A are arranged in n-fold rotational symmetry.

Note that, whether the plurality of relay conductors 29A are positioned on the same circumference may be judged for two or more relay conductors 29A predicated on the center C1 of the column main body 19d being the center of the circumference or may be judged for four or more relay conductors 29A without identifying the center C1. Further, in the above explanation, the relay conductors 29A were explained. The same is true for the relay conductors 29B. That is, in the above explanation, the relay conductors 29A may be substituted with by relay conductors 29B. Further, the circumference on which the relay conductors 29A are arranged and the circumference on which the relay conductors 29B are arranged are for example concentric circles.

In the example shown, the number of the relay conductors 29B is larger than the number of the relay conductors 29A. Further, in the example shown (see FIG. 2 as well), the diameters of the relay conductors 29B (the maximum diameters when not circular) are larger than the diameters of the relay conductors 29A (the maximum diameters when not circular). The relay conductors 29B are arranged so as to surround the center C1 at positions further away from the center C1 than the relay conductors 29A. Therefore, the arcs at the positions of the relay conductors 29B are longer than the arcs at the positions of the relay conductors 29A relative to the same central angle. Accordingly, even if the number of the relay conductors 29B is made relatively large as described above or the diameters of the relay conductors 29B are made large, the probability of short-circuiting is relatively low. However, the number of the relay conductors 29B may be the same as or may be smaller relative to the number of the relay conductors 29A. In the same way, the diameters of the relay conductors 29B may be the same or smaller relative to the diameters of the relay conductors 29A.

The numbers of the relay conductors 29 may be suitably set. For example, the numbers of the relay conductors 29 may be made two or more, four or more, or five or more. Further, the above number may be made 30 or less, 10 or less, or four or less. The above lower limits and the upper limits may be suitably combined unless they are contradictory.

Figure 4A:
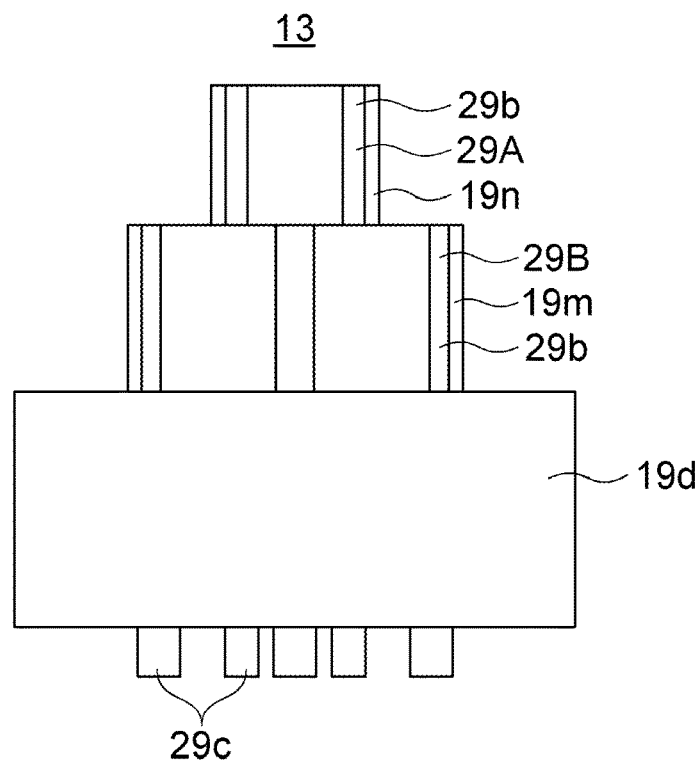
FIG. 4A is a side view of the upper pillar.
Figure 4B:
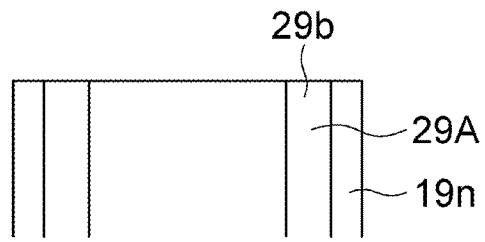
FIG. 4B is an enlarged view of a portion in FIG. 4A.
Figure 4C:
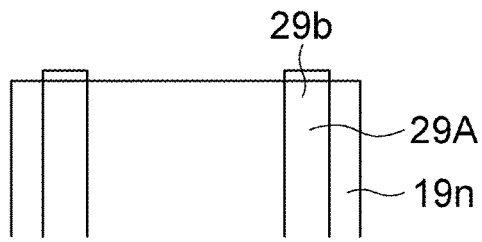
FIG. 4C is a view showing a modification of FIG. 4B.

FIG. 4A is a side surface view of the upper pillar 13. FIG. 4B is an enlarged view of a portion on the upper side in FIG. 4A. FIG. 4C is a view showing a modification of FIG. 4B.

As shown in FIG. 4B, the upper surfaces of the relay conductors 29A may be made flush with the upper surface of the small-diameter portion 19n (from another viewpoint, columnar body 19 or projecting portion 19e). Further, as shown in FIG. 4C, the upper ends of the relay conductors 29A may project from the upper surface of the small-diameter portion 19n. Further, although not particularly shown, the upper surfaces of the relay conductors 29A may be located at positions deeper than the upper surface of the small-diameter portion 19n as well. Note that, even if the positions in the vertical direction are different between the upper surfaces of the relay conductors 29A and the upper surface of the small-diameter portion 19n, they may be regarded as flush so far as the difference is within tolerance. For example, in a case where the difference of the positions is 1/5 or less or 1/10 or less of the diameters of the relay conductors 29A (the maximum diameter when not circular) and/or the difference of the positions is 1 mm or less or 0.1 mm or less, it may be grasped that the upper surfaces of the relay conductors 29A and the upper surface of the small-diameter portion 19n are flush.

The upper ends of the relay conductors 29A were explained, but the same is true for the upper ends of the relay conductors 29B. The above explanation may be employed for the relay conductors 29B by reading the "relay conductors 29A" and "small-diameter portion 19n" as the "relay conductors 29B" and "large-diameter portion 19m".

The specific shapes and various dimensions of the relay conductors 29 may be suitably set. For example, the shapes and sizes of the transverse cross-sections (cross-sections perpendicular to the long direction) of the portions (extension portions 29a) of the relay conductors 29 inside the columnar part 25 are constant in the long direction. Further, they may be made circular, polygonal, or other suitable shapes. Note that, in the explanation of the present embodiment, a case where the shapes of the transverse cross-sections of the extension portions 29a are circular will be taken as an example. The relay conductors 29 may be solid as illustrated or may be hollow shaped unlike the example shown.

The diameters (the maximum diameters when not circular) of the relay conductors 29 (extension portions 29a) may be made for example 0.05 mm or more or 0.3 mm or more. Further, the above diameter may be made 10 mm or less or 1 mm or less. The above lower limits and upper limits may be suitably combined. As the lengths of the relay conductors 29, for example, substantially the length of the column main body 19d (columnar part 25) in the vertical direction explained above may be employed. If described for safety's sake, for example, the lengths of the relay conductors 29 or the extension portions 29a in that may be made ⅒ or more, ½ or more, 2 times or more, 5 times or more, or 10 times or more of the thickness of the plate-shaped body 17. Further, for example, the above lengths may be made 20 times or less, 10 times or less, 5 times or less, 2 times or less, or ½ or less of the above thickness. The above lower limits and upper limits may be suitably combined unless they are contradictory. Further, for example, the lengths of the relay conductors 29 or extension portions 29a may be made 10 mm or more, 20 mm or more, or 30 mm or more. Further, the above lengths may be made 300 mm or less, 200 mm or less, or 100 mm or less. The above lower limits and upper limits may be suitably combined. Further, the lengths of the extension portions 29a may be made 1 time or more, 10 times or more, or 100 times or more of the diameters of the extension portions 29a (the maximum diameters when not circular). The examples of the ranges of the lengths of the relay conductors 29 or extension portions 29a described above may be applied to any of a case where the extension portions 29a linearly extend in parallel to the vertical direction from the upper end to the lower end of the column main body 19d and cases other than this.

Figure 4D:
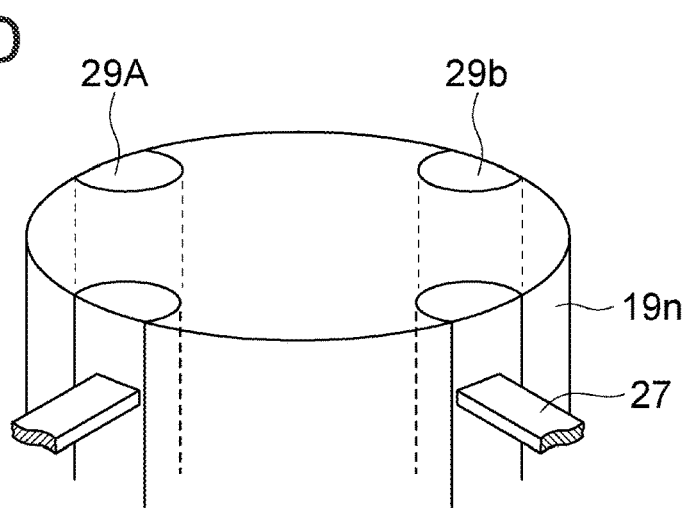
FIG. 4D is a perspective view showing an upper part side in the upper pillar in an enlarged manner.

FIG. 4D is a perspective view showing the upper side of the small-diameter portion 19n in an enlarged manner.

As shown in FIG. 2 and FIG. 4D, the portions in the relay conductors 29A positioned in the small-diameter portion 19n (portions of the connection portions 29b) are shaped with portions removed compared with portions (extension portions 29a) in the relay conductors 29A positioned inside the column main body 19d (columnar part 25).

From another viewpoint, the connection portions 29b of the relay conductors 29A are shaped so that, when viewed on a plane, portions on the side opposite from the center C1 of the columnar part 25 are removed from predetermined shapes (shapes of the extension portions 29a when viewed on a plane, here, circles) by using lines extending from the outer edges of the small-diameter portion 19n as boundaries. In other words, when viewed on a plane, portions of the outer edges of the connection portions 29b smoothly continue from the outer edges of the small-diameter portion 19n as if they configured portions of the outer edges of the small-diameter portion 19n. The "smoothly continue" referred to here means for example there are no steps and bends formed at the joined parts of portions of the outer edges of the connection portions 29b and the outer edges of the small-diameter portion 19n. Note that, even if there are steps, it may be considered that the "continue" holds so far as the sizes of the steps are within tolerances. For example, in a case where the steps are ⅕ or less or 1/10 or less of the diameters (maximum diameters) of the connection portions 29b and/or where the steps are 1 mm or less or 0.1 mm or less, it may be considered that the "continue" holds. The presence of any bends may be rationally judged by visual observation of an enlarged image of the cross-section.

In the present embodiment, the above predetermined shapes relating to the relay conductors 29A are circular shapes (referred to as "first circular shape" in the present paragraph). Accordingly, from another viewpoint, when viewed on a plane, the connection portions 29b of the relay conductors 29A are shaped as the first circular shapes from which portions on the opposite side to the center C1 of the columnar part 25 are removed. Further, when viewed on a plane, the shape of the small-diameter portion 19n is a circular shape having a larger diameter than the diameters of the first circular shapes. Accordingly, from another viewpoint, when viewed on a plane, the connection portions 29b of the relay conductors 29A are shaped as the first circular shapes from which portions on the opposite side to the center C1 are removed by using arcs as boundaries. The arcs have smaller curvatures than the circumferences of the first circular shapes and have the center C1 sides of the columnar parts 25 as the center sides of curvature.

The removed portions described above are portions on the opposite sides to the center of the small-diameter portion 19n relative to the centers of the predetermined shapes (shapes of the extension portions 29a when viewed on a plane, here, circular). Accordingly, portions having the maximum diameters in the predetermined shapes when viewing the connection portions 29b in the horizontal direction from the center of the small-diameter portion 19n are not removed, but remain. From another viewpoint, when viewed on a plane, the connection portions 29b are maintained in the outward engagement shapes with respect to the small-diameter portion 19n. However, such shapes need not be maintained as well.

Note that, unlike the example shown, the side surfaces of the relay conductors 29A, may be positioned deeper from the side surface of the small-diameter portion 19n or may be located on the outer sides from the side surface of the small-diameter portion 19n. The same is true also in a case where, as in the example shown, the shapes of the connection portions 29b when viewed on a plane are shapes of circular shapes from which portions are removed by using arcs having smaller curvatures than the circular shapes as boundaries. Further, circular shapes were taken as examples as the shapes of the portions of the relay conductors 29A inside the columnar part 25 when viewed on a plane and a circular shape was taken as an example as the shape of the small-diameter portion 19n when viewed on a plane. However, they are only one example. For example, the shape of the small-diameter portion 19n may be made rectangular or another polygonal shape, and the shapes of the connection portions 29b of the relay conductors 29A when viewed on a plane may be made shapes of circular shapes from which portions are removed by using straight lines as boundaries.

The shapes of the connection portions 29b of the relay conductors 29A were explained above, but the same is true for the relay conductors 29B. The above explanation may be employed for the connection portions 29b of the relay conductors 29B by reading the "relay conductors 29A" and "small-diameter portion 19n" as the "relay conductors 29B" and "large-diameter portion 19m".

The materials of the relay conductors 29 may be suitably set. For example, as the materials of the relay conductors 29, there can be mentioned W, Mo, Pt, or Ni. The materials of the relay conductors 29 may be the same as or different from the materials of the internal conductors (resistance heating elements 27).

(Lower Base Body)

Returning to FIG. 2, the lower base body 21 is for example basically (excluding the lower channels 21c etc.) a solid member. The shape and dimensions of the lower base body 21 may be suitably set. The lower base body 21 may have a length in the vertical direction larger than, equal to, or smaller than the diameter (for example the maximum diameter when it is not circular when viewed on a plane).

The lower base body 21 for example has a base main body 21d and flanges 21f which project outward from the lower end of the base main body 21d. In the flanges 21f, holes 21fh vertically passing through the flanges 21f are formed. Although not particularly shown, bolts are inserted in the holes 21fh and the bolts are screwed into suitable support members in a chamber accommodating the heater 1. That is, the flanges 21f contribute to mounting of the heater 1.

The shape of the transverse cross-section (horizontal cross-section) of the base main body 21d (for example the shape at the upper end) may be similar to (including "congruent with") or may not be similar to the shape of the transverse cross-section of the column main body 19d in the columnar body 19 (for example the shape at the lower end). Further, the size of the transverse cross-section of the base main body 21d (for example the size at the upper end) may be equal to (example shown), larger than, or smaller than the size of the transverse cross-section of the column main body 19d (for example the size at the lower end).

The shape of the transverse cross-section of the base main body 21d may be made circular (example shown) or polygonal or another suitable shape. In the base main body 21d, the shape and area of the transverse cross-section may be constant (example shown) or may change in the vertical direction. Further, for example, one of a projecting portion and a recessed portion for positioning the columnar body 19 and the base main body 21d around the vertical axis may be formed at the lower end of the columnar body 19, and the other may be formed at the upper end of the base main body 21d.

The material of the lower base body 21 is for example ceramic. As the specific material of the ceramic, for example, one explained in the explanation of the plate-shaped body 17 (AlN or the like) may be utilized. Further, the material of the lower base body 21 may be the same as or different from the material of the plate-shaped body 17 and/or columnar body 19. In a case where the material of the lower base body 21 is different from the material of the plate-shaped body 17 and/or columnar body 19, the principal constituents of the two may be the same or may be different.

(Lower Conductors)

The plurality of lower conductors 31 (31A and 31B) are for example configured by metals linearly extending in parallel to the vertical direction inside the lower base body 21. However, for example, the lower conductors 31 may bend in the middle, may have portions extending in the horizontal direction in the middle, or may extend with inclinations relative to the vertical direction.

The pluralities of lower conductors 31 (31A and 31B) are for example exposed at positions in the upper surface of the lower base body 21 which face the lower ends of the relay conductors 29. Due to this, the lower conductors 31 become able to be connected to the relay conductors 29. The plurality of lower conductors 31 have the lower conductors 31A which are connected to the relay conductors 29A and lower conductors 31B which are connected to the relay conductors 29B. Further, the plurality of lower conductors 31, for example, are exposed to the exterior of the lower base body 21 at the lower surface of the lower base body 21.

The specific shapes and various dimensions of the lower conductors 31 may be suitably set. For example, the shapes and sizes of the transverse cross-sections (cross-sections perpendicular to the long direction) of the lower conductors 31 are constant in the long directions excluding the end parts. Further, the shapes of the transverse cross-sections of the lower conductors 31 may be made circular or polygonal or another suitable shape. Further, the above shapes may be similar to (including "congruent with") or may not be similar to the shapes of the transverse cross-sections of the relay conductors 29. In the explanation of the present embodiment, an aspect where the transverse cross-sections of the lower conductors 31 have circular shapes larger than the transverse cross-sections of the relay conductors 29 (similar from another viewpoint) will be taken as an example.

The materials of the lower conductors 31 may also be suitably set. For example, as the materials of the lower conductors, there can be mentioned W, Mo, Pt, or Ni. The materials of the lower conductors 31 may be the same as or different from the materials of the internal conductors (resistance heating elements 27) and/or the materials of the relay conductors 29.

(Joined Portion of Plate-Shaped Body and Columnar Body)

Returning to FIG. 1B, the plate-shaped body 17 and the columnar body 19 are for example joined by direct contact. In more detail, for example, as will be understood from the manufacturing method which will be illustrated later, at the boundary between the plate-shaped body 17 and the columnar body 19, ceramic particles of the two are adhered to each other. Due to this, they are joined to each other. In the columnar body 19, the surfaces joined with the plate-shaped body 17, in the present embodiment, are the upper surface of the column main body 19d and side surfaces and upper surfaces of the projecting portion 19e (the side surface and upper surface of the large-diameter portion 19m and the side surface and upper surface of the small-diameter portion 19n). In the plate-shaped body 17, the surfaces joined to the columnar body 19, in the present embodiment, are portions on the periphery of the recessed portion 17r in the lower surface 17b and the inner surface of the recessed portion 17r.

Figure 5A:
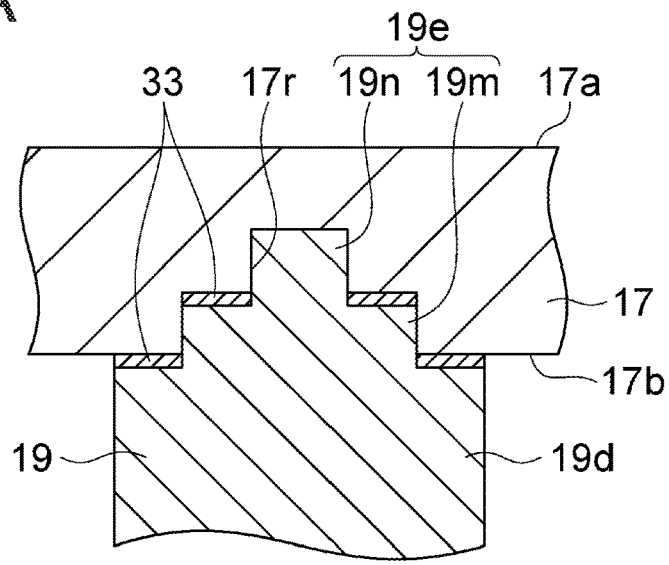
FIG. 5A, FIG. 5B, and FIG. 5C are views showing various modifications of a joined portion of a heater plate and the heater pillar in the heater in FIG. 1A.

FIG. 5A is a cross-sectional view showing a modification relating to the joined portion of the plate-shaped body 17 and the columnar body 19 and corresponds to a partially enlarged view of FIG. 1B.

In this example, the plate-shaped body 17 and the columnar body 19 are joined by a bonding material 33. The bonding material 33 is for example made of an insulation material. Further, the bonding material 33 may be an organic material or may be an inorganic material. Specifically, as the bonding material 33, for example, use may be made of a glass material. That is, the plate-shaped body 17 and the columnar body 19 may be glass-bonded. Further, as the bonding material 33, use may be made of a CaO—$Al_2O_3$—$Y_2O_3$ material as well.

The position where the bonding material 33 is arranged may also be suitably set. For example, in the columnar body 19, the upper surface of the column main body 19d and the upper surfaces and side surfaces of the projecting portion 19e (side surface and upper surface of the large-diameter portion 19m and the side surface and upper surface of the small-diameter portion 19n) are made to face peripheral portions of the recessed portion 17r in the lower surface 17b of the plate-shaped body 17 and the inner surface of the recessed portion 17r. The bonding material 33 may be arranged in portions (example shown) of the above facing surfaces or may be arranged at all of the same.

In the example shown, in more detail, the bonding material 33 is provided on the upper surface of the large-diameter portion 19m (for example its entire surface) and the upper surface of the column main body 19d (for example its entire surface). The bonding material 33 positioned on the upper surface of the large-diameter portion 19m surrounds the lower end of the small-diameter portion 19n and contributes to sealing of the connection portions 29b of the relay conductors 29A, which are exposed from the small-diameter portion 19n. The bonding material 33 positioned on the upper surface of the column main body 19d surrounds the lower end of the large-diameter portion 19m and contributes to sealing of the connection portions 29b of the relay conductors 29B which are exposed from the large-diameter portion 19m.

Note that, in the surfaces of the plate-shaped body 17 and the columnar body 19 which are made to face each other as described above, the regions where the bonding material 33 is not arranged for example just abut against each other. However, the regions may be bonded to each other by adhesion of ceramic particles to each other as well.

Figure 5B:
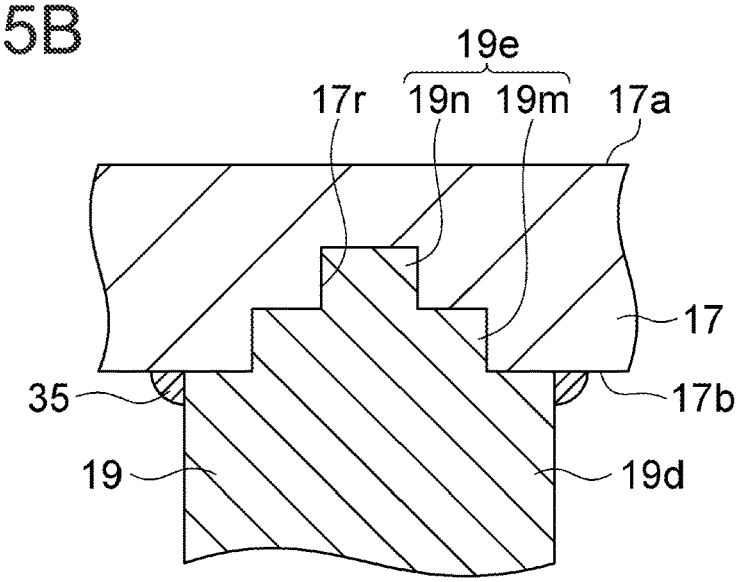

FIG. 5B is a cross-sectional view showing another modification relating to the joined portion between the plate-shaped body 17 and the columnar body 19 and corresponds to a partially enlarged view in FIG. 1B.

In this example, provision is made of a sealing material 35 which seals a gap between the recessed portion 17r in the plate-shaped body 17 and the projecting portion 19e in the column main body 19d. The sealing material 35 is adhered to the lower surface 17b of the plate-shaped body 17 and the side surface of the column main body 19d so as to surround the column main body 19d. This sealing material 35 may be provided in an aspect where the plate-shaped body 17 and the columnar body 19 are directly joined or may be provided in an aspect where the plate-shaped body 17 and the columnar body 19 are joined through the bonding material 33.

The material of the sealing material 35 may be made a suitable one. For example, the sealing material 35 is made of an insulation material. Further, the sealing material 35 may be an organic material or may be an inorganic material. Specifically, as the sealing material 35, for example, use may be made of a glass bonding material used for glass bonding. Further, as the sealing material 35, use may be made of a CaO—$Al_2O_3$—$Y_2O_3$ material.

(Connections of Resistance Heating Elements and Relay Conductors)

As shown in FIG. 2 and FIG. 4D, the relay conductors 29 and the internal conductors (resistance heating elements 27) are for example connected at the side surfaces of the relay conductors 29. However, the two may be connected on the upper end surfaces of the relay conductors 29 unlike the example shown as well. Further, in a case where the upper ends of the relay conductors 29 project upward from the columnar body 19 (FIG. 4C), the connection may be carried out at the side surfaces of the above upper ends as well. The relay conductors 29 and the resistance heating elements 27 may for example be connected by direct abutment of the two against each other as shown in FIG. 4D.

Figure 5C:
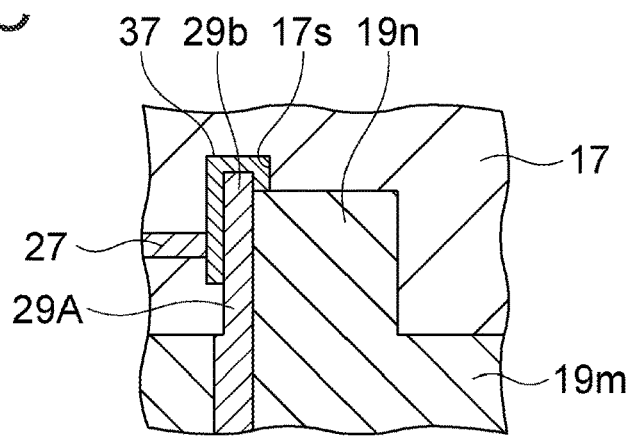

FIG. 5C is a cross-sectional view showing a modification of the connection of the relay conductors 29 and the resistance heating elements 27.

As shown in this view, the relay conductors 29 and the resistance heating elements 27 may be connected by a material different from the two and/or other members interposed between the two. In the example shown, between the resistance heating elements 27 and the relay conductors 29, conductive intermediate layers 37 are interposed.

The material of the intermediate layers 37 may be made a suitable one. For example, the intermediate layers 37 are configured by a composite material containing the same constituents as the material of the resistance heating elements 27 and the same constituents as the material of the plate-shaped body 17 (and/or plate-shaped part 23). The "containing the same constituents" means for example "containing the same atoms". As such a composite material, for example, there can be mentioned ones containing W and AlN in a case where the resistance heating elements 27 are made of W or an alloy containing W as the principal constituent, and the plate-shaped body 17 is configured by a sintered body of AlN or a sintered body containing AlN as the principal constituent.

As explained with reference to FIG. 4B and FIG. 4C, the relay conductors 29 (connection portions 29b) may have upper ends which project from the upper surface of the projecting portion 19e (small-diameter portion 19n or large-diameter portion 19m) as well. In this case, as shown in FIG. 5C, holes 17s (recessed portions) in which the upper ends of the relay conductors 29 are inserted may be formed in the recessed portion 17r as well. In this case, at least portions of the intermediate layers 37 may be arranged in the holes 17s. Note that, in FIG. 5C, the relay conductors 29A are illustrated, but the same is true for the relay conductors 29B.

Note that, although not particularly shown, the upper ends of the relay conductors 29 may be made to project from the upper surface of the projecting portion 19e (small-diameter portion 19n or large-diameter portion 19m), and the holes 17s need not be provided. In this case, for example, a gap having a height in accordance with the amounts of projection of the relay conductors 29 from the upper surface of the projecting portion 19e is configured between the upper surface of the projecting portion 19e and the surface of the recessed portion 17r which faces the lower part. In this case, at least a portion of the intermediate layer 37 may be arranged in the gap.

(Coupling of Columnar Body and Lower Base Body)

The columnar body 19 and the lower base body 21 may be coupled by a suitable method. For example, although not particularly shown, the two may be fastened by an adhesive, may be fastened by direct bonding (for example diffusion bonding), or may be fastened by mechanical bonding using bolts and nuts or the like. Further, for example, the relay conductors 29 and the lower conductors 31 may be connected as explained later to position the columnar body 19 and the lower base body 21 in the horizontal direction. For the vertical direction, the columnar body 19 need merely be placed on the lower base body 21.

Further, at the coupling portion of the columnar body 19 and the lower base body 21, a suitable sealing structure may be employed. For example, in the example in FIG. 2, the upper surface of the lower base body 21 is formed with a recessed groove (notation is omitted) circling it along the outer edge and a packing 39 is arranged in the recessed groove. The packing 39 is for example an O-ring. Further, this packing 39 abuts against the bottom surface of a recessed groove 19r formed in the lower surface of the columnar body 19. Due to this, a part between the lower surface of the columnar body 19 and the upper surface of the lower base body 21 are sealed. In this sealed region, the relay conductors 29 and lower conductors 31 are exposed and, further, the upper channels 19c and lower channels 21c open.

(Connection of Relay Conductors and Lower Conductors)

Figure 6:
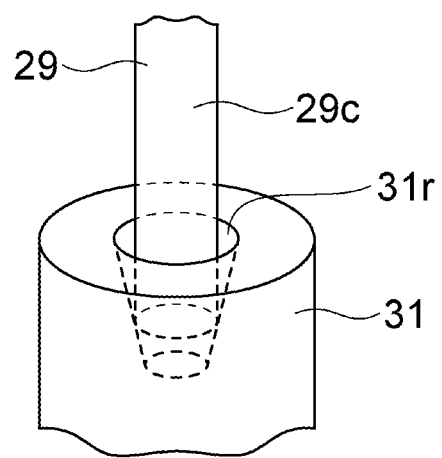
FIG. 6 is a perspective view showing an example of a connection method of a relay conductor in the upper pillar and a lower conductor in a lower pillar in the heater in FIG. 1A.

FIG. 6 is a perspective view showing an example of a method of connection of the relay conductors 29 and the lower conductors 31.

In this example, recessed portions 31r are formed in the upper surfaces of the lower conductors 31. In the recessed portions 31r, portions of the relay conductors 29 which project from the lower surface of the column main body 19d (projecting portions 29c) are inserted. Further, the projecting portions 29c and the inner surfaces of the recessed portions 31r abut. Due to this, the relay conductors 29 and the lower conductors 31 are electrically connected. Further, due to the abutment of the projecting portions 29c and the inner surfaces of the recessed portions 31r, the upper pillar 13 and the lower pillar 15 are also positioned in the horizontal direction.

The shapes of the projecting portions 29c and the shapes of the recessed portions 31r may be made suitable ones. In the example shown, the projecting portions 29c extend with a constant transverse cross-section (here, circular). On the other hand, the recessed portions 31r have tapered surfaces increasing in diameter the more to the upper side. Accordingly, if the projecting portions 29c are inserted into the recessed portions 31r, the outer edges of the front end surfaces of the projecting portions 29c abut against the tapered surfaces. Due to this, the reliability of connection between the projecting portions 29c and the inner surfaces of the recessed portions 31r can be improved. Further, the shapes of the transverse cross-sections (planes parallel to the horizontal direction) of the portions of the recessed portions 31r configured by the tapered surfaces (the entireties of the recessed portions 31r in the example shown) are similar to the shapes of the transverse cross-sections of the projecting portions 29c. Accordingly, the projecting portions 29c and the tapered surfaces abut over the entire circumferences of the projecting portions 29c if ignoring processing precision.

Note that, unlike the example shown, the projecting portions 29c may also be provided with tapered surfaces decreasing in diameter the more toward the lower end side. Further, unlike the example shown, the lower surfaces of the relay conductors 29 and the upper surfaces of the lower conductors 31 may be made to directly abut against each other or conductive elastic members or conductive grease may be interposed between the relay conductors 29 and the lower conductors 31. Further, conversely to the example shown, recessed portions may be formed in the lower surfaces of the relay conductors 29, and the upper ends of the lower conductors 31 may be inserted in the recessed portions.

(Channels)

Returning to FIG. 2, the shapes and dimensions etc. of the plate channels 17c, upper channels 19c, and lower channels 21c may be suitably set in accordance with purpose of the fluid supplied to these channels and the like. In the example shown, single ends of the plate channels 17c open in regions in the lower surface 17d of the plate-shaped body 17 which face the upper surface of the column main body 19d. The upper channels 19c linearly extend in the vertical direction through the column main body 19d. Upper ends of the upper channels 19c open in the upper surface of the column main body 19d. Lower ends of the upper channels 19c open in the lower surface of the column main body 19d. Further, the lower channels 21c linearly extend in the vertical direction through the lower base body 21. Upper ends of the lower channels 21c open in the upper surface of the lower base body 21. Lower ends of the lower channels 21c open in the lower surface of the lower base body 21.

Further, in the example shown, two sets of combinations of the plate channels 17c, upper channels 19c, and lower channels 21c linked together are provided. Both of these two sets may be ones supplying fluids into the plate-shaped body 17 or they may be connected to each other inside the plate-shaped body 17 and one used for supply of fluid, and the other used for recovery of the fluid.

Although not particularly shown, the plate channels 17c and the upper channels 19c may be connected to each other at the upper surfaces and/or side surfaces of the projecting portion 19e in place of or in addition to the upper surface of the column main body 19d. Further, the upper channels 19c and the lower channels 21c need not be ones for supplying fluid to the plate-shaped body 17 and may be ones ending inside the columnar body 19 and the lower base body 21. As such channels, for example, there can be mentioned ones for coolant for cooling the columnar body 19 and the lower base body 21.

(First Example of Manufacturing Method of Heater)

Figure 7:
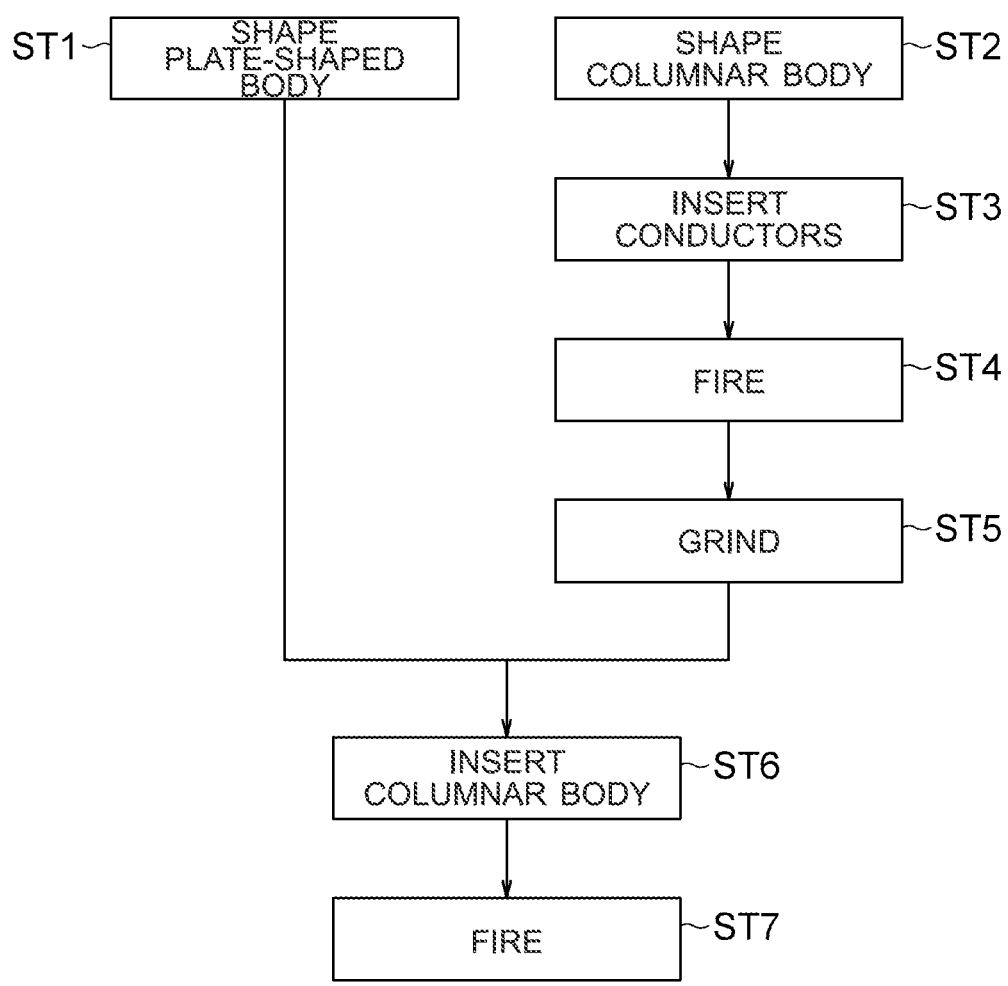
FIG. 7 is a flow chart showing an outline of the procedure of a first example of a method for manufacturing the heater in FIG. 1A.

FIG. 7 is a flow chart showing an outline of the procedure of a first example of the method for manufacturing the heater 1.

At step ST1, a plate-shaped body 17 (second shaped member) before firing is prepared. This method of preparation may be made the same as various known methods except for the specific shapes of the recessed portion 17r etc. For example, the second shaped member may be prepared by stacking a plurality of ceramic green sheets on which conductive pastes for forming the resistance heating elements 27 are arranged. The recessed portion 17r is for example configured by formation of through holes or recessed portions for forming the recessed portion 17r in the ceramic green sheets before stacking. Further, for example, the second shaped member may be prepared by arranging coils for forming the resistance heating elements 27 and ceramic material powder for forming the plate-shaped body 17 in a die and pressing them. In this case, the recessed portion 17r is formed by formation of a projecting portion at the inner surface of the die.

At steps ST2 to ST5, in parallel with step ST1, the upper pillar 13 is prepared. Specifically, first, at step ST2, a columnar body 19 before firing (first shaped member) is prepared. The method of preparation of the first shaped member may be made the same as various known methods except for its specific shape. For example, the columnar body 19 is formed by pressing the ceramic material powder in the die. Due to this, the first shaped member having a shape corresponding to the column main body 19d and projecting portion 19e is formed.

Next, at step ST3, shaft-shaped metal members for forming the relay conductors 29 are inserted into the columnar body 19 before firing (first shaped member). Preceding this insertion, the first shaped member may be formed with holes into which the relay conductors 29 are to be inserted. The holes may be formed by cores when shaping the first shaped member by the die or may be formed after shaping by drilling. Further, at this stage, for example, the relay conductors 29 are only exposed from the lower surface of the column main body 19d and the upper surfaces of the projecting portion 19e, and are not exposed from the side surfaces of the projecting portion 19e. However, they may be exposed as well. Further, in the same way as the formation of holes into which the relay conductors 29 are to be inserted, holes forming the upper channels 19c may be formed at a suitable timing.

At step ST4, the columnar body 19 before firing (first shaped member) is fired. The firing method may be made the same as various known methods. Due to the firing, the first shaped member contracts. By this contraction, the columnar body 19 may fasten the relay conductors 29. Due to this, the strength of fixing of the columnar body 19 and the relay conductors 29 is improved. For such fastening, the diameters of the holes in the first shaped member into which the relay conductors 29 are to be inserted are made sizes which are the diameters of the relay conductors 29 or more and which become smaller than the diameters of the relay conductor 29 by contraction after firing (when assuming that there are no relay conductors 29). The difference between the diameters of the relay conductors 29 and the diameters of the holes after contraction when assuming that there are no relay conductors 29 may be made for example 0.2 mm to 0.4 mm.

Note that, in place of step ST3, it is also possible to arrange the metal members for forming the relay conductors 29 and the ceramic material powder for forming the columnar body 19 in the die and pressing them at step ST2 so as to thereby form the first shaped member in which the relay conductors 29 are inserted. In this case, the shapes of the relay conductors 29 are not limited to shapes whereby insertion is possible (shapes at least linearly extending from single ends up to the middle). For example, the relay conductors 29 may be shaped suitably bent inside the first shaped member. Further, at step ST2, it is possible to perform not only pressing, but also heating (that is, perform hot pressing) and omit step ST4.

At step ST5, the side surfaces of the projecting portion 19e are grinded. Due to this, the side surfaces of the relay conductors 29 are exposed from the side surfaces of the projecting portion 19e. Further, by grinding the side surfaces of the relay conductors 29 together with the side surfaces of the projecting portion 19e, when viewed on a plane, the shapes of the connection portions 29b of the relay conductors 29 become shapes of the original shapes (circular shapes in the present embodiment) with portions removed by using lines extending from the outer edges of the projecting portion 19e (here, arcs having smaller curvatures than those of the circular shapes) as boundaries.

At step ST6, the projecting portion 19e of the columnar body 19 after firing is inserted into the recessed portion 17r in the plate-shaped body 17 before firing (second shaped member). After that, at step ST7, the two are fired. Due to this, the plate-shaped body 17 and the columnar body 19 are joined. That is, the joined member of the plate-shaped body 17 and the columnar body 19 is obtained. At the joined surfaces, the state becomes one where ceramic particles of the two are adhered to each other. If the materials of the two are the same or their principal constituents are the same, the boundary of the two becomes unclear or disappears.

Due to firing, the plate-shaped body 17 (second shaped member) contracts. By this contraction, the plate-shaped body 17 may fasten the projecting portion 19e of the columnar body 19. Further, along with this fastening, the resistance heating elements 27 in the plate-shaped body 17 may be pushed against the portions in the relay conductors 29 which are exposed at the side surfaces of the projecting portion 19e. Due to this, the strength of fixing of the plate-shaped body 17 and the columnar body 19 is improved. Further, the reliability of connections between the relay conductors 29 and the resistance heating elements 27 is improved. For such fastening, the diameter of the recessed portion 17r before firing is made a size which is the diameter of the projecting portion 19e or more and which becomes smaller than the diameter of the projecting portion 19e by contraction after firing (when assuming that there is no projecting portion 19e). The difference between the diameter of the projecting portion 19e and the diameter of the recessed portion 17r after contraction when assuming that there is no projecting portion 19e may be made for example 0.2 mm to 0.4 mm.

At step ST6, a conductive paste for forming the intermediate layer 37 explained with reference to FIG. 5C may be arranged between the recessed portion 17r and the projecting portion 19e as well. This conductive paste may be made a material the same as the material configuring the resistance heating elements 27 (for example W or an alloy of W) or a material having the same principal constituent as that of the latter. In this case, the material of the plate-shaped body 17 before firing (second shaped member) or its principal constituent (for example AlN) is diffused or impregnated into the conductive paste. Due to this, an intermediate layer 37 made of a material containing the same constituents as the constituents of the material of the plate-shaped body 17 and resistance heating element 27 is formed.

In this first example, it is possible to directly join the plate-shaped body 17 and the columnar body 19. However, at step ST6, a material (for example glass) forming the bonding material 33 explained with reference to FIG. 5A may be arranged between the recessed portion 17r and the projecting portion 19e as well. Further, a material (for example glass) forming the sealing material 35 explained with reference to FIG. 5B may be for example arranged at the plate-shaped body 17 and the columnar body 19 between step ST5 and step ST6.

The method for manufacturing the lower pillar 15 may be made the same as the method for manufacturing the upper pillar 13 except for its specific shape and polishing process (step ST5).

(Second Example of Manufacturing Method of Heater)

Figure 8:
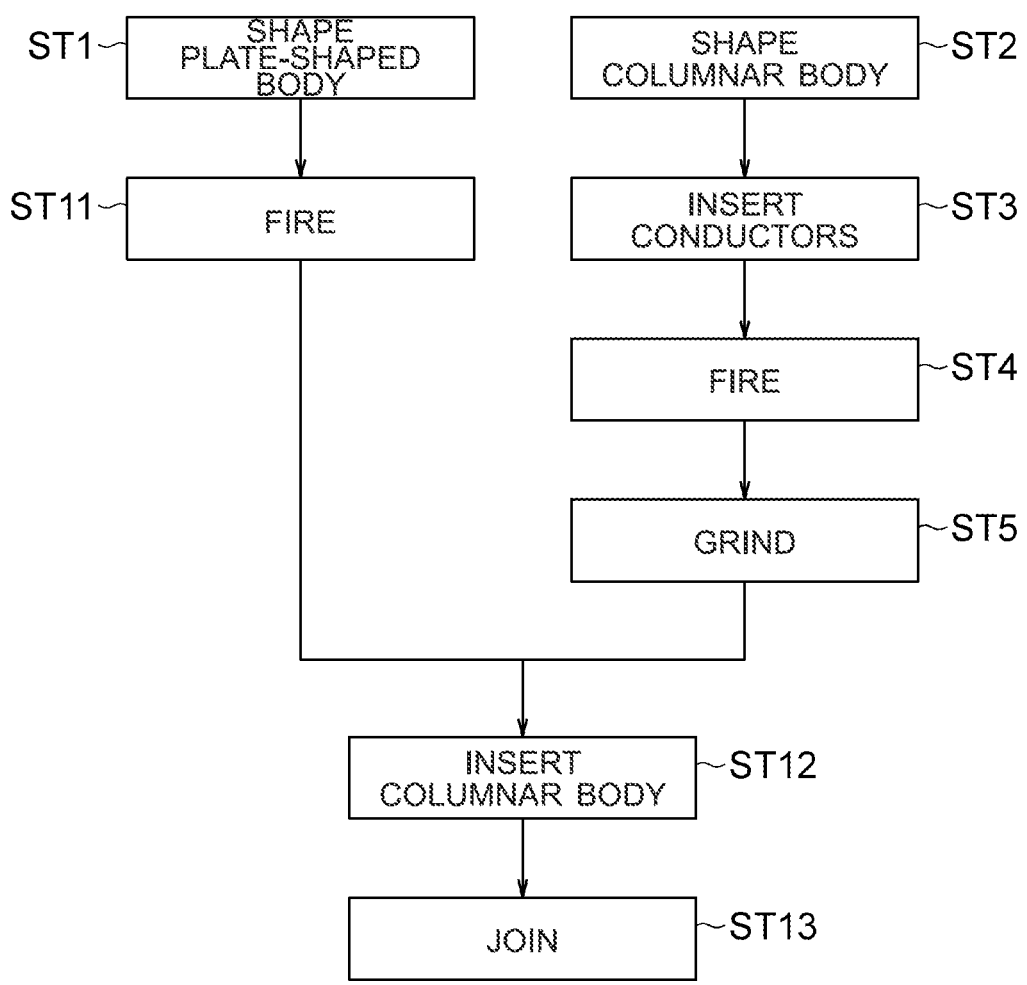
FIG. 8 is a flow chart showing an outline of the procedure of a second example of the method for manufacturing the heater in FIG. 1A.

FIG. 8 is a flow chart showing an outline of the procedure of a second example of the method for manufacturing the heater 1.

Steps ST1 to ST5 are the same as steps ST1 to ST5 in FIG. 7. In this example, the plate-shaped body 17 is fired before inserting the projecting portion 19e of the columnar body 19 into the recessed portion 17r in the plate-shaped body 17 and joining the two. That is, after step ST1, in parallel with steps ST2 to ST5, at step ST11, the second shaped member forming the plate-shaped body 17 is fired. After that, at step ST12, the projecting portion 19e is inserted into the recessed portion 17r. Further, at step ST13, the plate-shaped body 17 and the columnar body 19 are joined and a joined member of the two is obtained.

The joining operation at step ST13 may be carried out by various methods as already explained. For example, solid phase bonding may be utilized. As the solid phase bonding, for example, diffusion bonding may be utilized. In the diffusion bonding, the plate-shaped body 17 and the columnar body 19 are joined by heating and pressing. In this case, the ceramic particles in the two are adhered to each other. Depending on the materials of the plate-shaped body 17 and the columnar body 19, the boundary of the two becomes unclear or disappears in the same way as the case of firing. The diffusion bonding includes not only bonding making the plate-shaped body 17 and the columnar body 19 directly abut against each other, but also bonding arranging a material for promoting bonding between the two. The material may be a solid phase state as it is or may become a liquid phase state at the bonding. Further, for example, as explained with reference to FIG. 5A, bonding may be carried out by the bonding material 33 as well. For example, a glass paste may be arranged between the plate-shaped body 17 and the columnar body 19, then the heating and pressing may be performed.

In the same way as the first example, at step ST12, a conductive paste for forming the intermediate layer 37 explained with reference to FIG. 5C may be arranged between the recessed portion 17r and the projecting portion 19e as well. This conductive paste is for example heated at the diffusion bonding or bonding by the bonding material 33. Further, the intermediate layer 37 made of a material containing the constituents of the material of the resistance heating element 27 and the constituents of the material of the plate-shaped body 17 is formed.

Note that, as the method for manufacturing the heater 1, various methods are possible other than the first example and second example. For example, metal members for forming the resistance heating elements 27 and relay conductors 29 and the ceramic material powder for forming the plate-shaped part 23 and the columnar part 25 may be arranged in a die and pressed and heated. That is, the hot pressing method may be used to integrally form the plate-shaped part 23 and the columnar part 25.

As explained above, a wafer support member (heater 1) relating to the present embodiment has the plate-shaped part 23, one or more internal conductors (resistance heating elements 27), a columnar part 25, and a plurality of relay conductors 29. The plate-shaped part 23 has an insulation property. Further, it has the upper surface 17a on which the wafer Wf is to be superimposed and the lower surface 17b on the opposite side to the upper surface 17a. The resistance heating elements 27 are buried in the plate-shaped part 23. The columnar part 25 has an insulation property and projects downward from the lower surface 17b of the plate-shaped part 23. The plurality of relay conductors 29 have the extension portions 29a which vertically extend in the columnar part 25 and are electrically connected to the resistance heating elements 27.

Accordingly, for example, compared with a conventional case where the wirings electrically connected to the resistance heating elements are arranged in a pipe extending downward from the heater plate, it is made easier to protect the wirings (relay conductors 29) from gas and/or plasma around the heater. Further, for example, rather than using the terminals buried in the plate-shaped body and the wirings arranged in the pipe to form the conductors which are connected to the resistance heating elements 27, the relay conductors 29 alone can act as the terminals and wirings. As a result, the configuration is simplified. In this way, in the present embodiment, the configuration relating to electrical connection with the internal conductors is optimized.

Further, in the present embodiment, at least one of the plurality of relay conductors 29 further has a connection portion 29b which extends from the extension portion 29a in the columnar part 25 to the internal portion of the plate-shaped part 23. The internal conductor and the connection portion 29b are joined at the side surface or end surface (upper end surface) of the connection portion 29b.

In this case, for example, as described above, the relay conductors 29 alone can act as the terminals and wirings. Further, for example, due to the configuration of inserting the projecting portion 19e of the columnar body 19 into the recessed portion 17r in the plate-shaped body 17, relay conductors 29 extending into the plate-shaped part 23 can be realized. In this case, for example, the reliability relating to the fixation between the columnar body 19 and the plate-shaped body 17 can be improved.

Further, in the present embodiment, when viewed on a plane, the connection portions 29b of the relay conductors 29 are set away from the center C1 of the columnar part 25, and are shaped as circular shapes from which portions at the opposite side to the center C1 are removed.

In this case, for example, when viewed on a plane, the outer edges of the connection portions 29b have relatively long straight lines or curves facing the opposite side to the center C1. Accordingly, for example, it is easy to secure the contact areas with the resistance heating elements 27. Further, for example, the connection portions 29b shaped as circular shapes from which portions are removed can be realized by grinding the projecting portion 19e of the columnar body 19. In this case, for example, the connection portions 29b are protected by the projecting portion 19e strength-wise while connection of the resistance heating elements 27 to the side surfaces of the connection portions 29b is facilitated. That is, in a case where the projecting portion 19e is not provided and the connection portions 29b are made to project from the upper surface of the column main body 19d in order to facilitate the connection of the side surfaces of the connection portions 29b and the resistance heating elements 27 (such a case is also included in the art according to the present disclosure), the probability of breakage or bending of the connection portions 29b is high, but such a probability can be lowered.

Further, in the present embodiment, the connection portions 29b of shapes of the above circular shapes (defined as first circular shapes) from which portions are removed have shapes of the first circular shapes from which portions on the opposite side to the center C1 of the columnar part 25 are removed by using arcs as boundaries. The arcs have smaller curvatures than the circumferences of the first circular shapes and have the center C1 side of the columnar part 25 as the center side of curvature.

In this case, for example, when viewed on a plane, the outer edges of the connection portions 29b have curves which face the opposite side to the center C1 and have small curvature. Accordingly, for example, compared with an aspect where the outer edges of the connection portions 29b are circular having the same curvatures as the arcs on the center C1 side (such an aspect is also included in the art according to the present disclosure), it is easy to secure the contact areas with the resistance heating elements 27.

Further, in the present embodiment, two or more relay conductors 29A (or two or more relay conductors 29B) have the connection portions 29b. When viewed on a plane, the connection portions 29b of the two or more relay conductors 29A are positioned on the same circumference having the center C1 of the columnar part 25 as its center. From another viewpoint, four or more relay conductors 29A (or four or more relay conductors 29B) have the connection portions 29b. When viewed on a plane, the connection portions 29b of the four or more relay conductors 29A are positioned on the same circumference having the center C1 side of the columnar part 25 as its center side.

In this case, for example, the portions of the outer edges of the connection portions 29b with small curvatures at the opposite side to the center C1 are connected with the resistance heating elements 27 on the same circumference. As a result, for example, complication of the resistance heating elements 27 near the center is reduced and it becomes easy to evaluate the mutual influences of the portions in the resistance heating elements 27 which are connected to the connection portions 29b. Further, the relay conductors 29A being positioned on the same circumference means, from another viewpoint, that the relay conductors 29A are arranged along the outer edges of the circular-shaped projecting portion 19e when viewed on a plane. In this case, for example, it is easy to form the plurality of relay conductors 29A into the same shapes by grinding the side surfaces of the columnar projecting portion 19e.

Further, in the present embodiment, when viewed on a plane, the connection portions 29b of four or more relay conductors 29A (or four or more relay conductors 29B) are point symmetrically arranged with respect to the center of the circumference on which these relay conductors 29A are arranged (the center C1 of the columnar part 25).

In this case, for example, the influences of residual stresses and/or thermal stresses which are generated between the connection portions 29b and the plate-shaped part 23 are easily made equal. As a result, for example, the probability of increase of local stress can be lowered. The connection portions 29b are shaped with portions on the outer side of the center C1 removed when viewed on a plane, therefore the diameters in the circumferential direction around the center C1 are apt to become larger than the diameters in the radial direction from the center C1. On the other hand, due to the point symmetrical arrangement, it becomes easier to secure the pitch of the connection portions 29b from each other in the circumferential direction. As a result, the effect of lowering the probability of increase of local stress is improved.

Further, in the present embodiment, the plurality of relay conductors 29 (29A and 29B) have first relay conductors (relay conductors 29A) and second relay conductors (relay conductors 29B). The relay conductors 29B are set further away from the center C1 of the columnar part 25 than the relay conductors 29A when viewed on a plane, and have upper ends are positioned higher than the upper ends of the relay conductors 29A (side where the upper surface 17a on which the wafer Wf is to be superimposed faces).

In this case, for example, the configuration of electrical connection of the two layers of resistance heating elements 27 and the plurality of relay conductors 29 is simplified. Further, the configuration such as explained above can be realized by providing a projecting portion (small-diameter portion 19n) which projects upward from the region provided with the relay conductors 29B when viewed on a plane. In this case, it is easy to make the relay conductors 29A be exposed from the side surface of the small-diameter portion 19n. In turn, it is easy to secure the contact areas of the relay conductors 29A and the resistance heating elements 27.

Further, in the present embodiment, the heater 1 further has the lower base body 21 and lower conductors 31. The lower base body 21 has an insulation property and is fixed to the lower part of the columnar part 25. The lower conductors 31 are buried in the lower base body 21 and are electrically connected to the relay conductors 29.

In this case, for example, before mounting the heater 1, the upper pillar 13 (and heater plate 9) and the lower pillar 15 can be separately conveyed. As a result, for example, the volume of conveyance is reduced and in turn the conveyance costs can be reduced. From this viewpoint, for example, the ratio of the length of the upper pillar 13 in the vertical direction in the length of the heater pillar 11 in the vertical direction may be made small. The upper pillar 13 is joined with the heater plate 9. The joined member of the two is large in the horizontal direction, therefore by making the length of the upper pillar 13 in the vertical direction short, conveyance becomes easier in many cases. For example, the length of the upper pillar 13 in the vertical direction may be made the length of the lower pillar 15 in the vertical direction or less. Further, in a case where the heater pillar 11 is configured by the upper pillar 13 and lower pillar 15, for example, in accordance with the specifications requested, it is possible to replace just one of the upper pillar 13 and the lower pillar 15 or change the design of just one. That is, a versatility of the upper pillar 13 and/or lower pillar 15 is improved, therefore the productivity is improved.

Further, in the present embodiment, the relay conductors 29 are exposed from the columnar part 25 in the region in the surface of the columnar part 25 which is concealed from the outside by the lower base body 21 (in the example shown, the lower surface of the columnar part 25). Due to this, the relay conductors 29 are electrically connected with the lower conductors 31.

In this case, for example, the effect due to configuring the heater pillar 11 by the upper pillar 13 and the lower pillar 15 as described above is obtained while protection of the electrical connection portions of the two from the gas and/or plasma around them is facilitated.

Further, in the present embodiment, the relay conductors 29 have projecting portions 29c which project from the lower surface of the columnar part 25. The lower conductors 31 have recessed portions 31r which are exposed from the upper surface of the lower base body 21. The projecting portions 29c are inserted in the recessed portions i31r.

In this case, for example, the portions in the relay conductors 29 which are exposed from the columnar parts 25 are covered by the lower conductors 31. As a result, for example, the relay conductors 29 are easily protected from gas and/or plasma around them. Here, between a case where a relay conductor 29 is contaminated and the upper pillar 13 and the heater plate 9 joined with this are exchanged and a case where a lower conductor 31 is contaminated and the lower pillar 15 is exchanged, usually the later case is more advantageous in terms of costs. Accordingly, the costs of the heater 1 can be lowered as a whole. Further, by insertion of the projecting portions 29c in the recessed portions 31r, the electrical connections also act for positioning the upper pillar 13 and the lower pillar 15.

In the present embodiment, the plate-shaped part 23 has the first channels (plate channels 17c). The columnar part 25 has second channels (upper channels 19c) communicated with the plate channels 17c.

Here, in an aspect as in a conventional case where a pipe extending downward from the heater plate 9 is provided, the channels are formed between the inner surface and the outer surface of the pipe. When compared with this aspect, in the present embodiment, the upper channels 19c are formed in the columnar part 25 which is basically solid, therefore the degree of freedom of design of the cross-sectional areas of the upper channels 19c and the connection positions of the upper channels 19c with respect to the heater plate 9 is high. For example, in an extreme example, although not particularly shown, it is also possible to form the upper channels 19c in the center side portion of the columnar part 25 (with a pipe, the portion forming a space for holding the wirings).

Further, in the present embodiment, at least one of the portion between the plate-shaped part 23 and the columnar part 25 and the internal portion of the plate-shaped part 23 is further provided with a sealing agent layer (bonding material 33) which is made of a material different from both of the materials of the plate-shaped part 23 and columnar part 25 and which surrounds a predetermined position in the vertical direction of at least one of the plurality of relay conductors 29 when viewed on a plane.

In this case, for example, the bonding material 33 can seal a part between the side surfaces of the projecting portion 19e of the columnar body 19 and the inner surfaces of the recessed portion 17r in the plate-shaped body 17. As a result, for example, it is easy to protect the portions in the relay conductors 29 which are exposed from the side surfaces of the projecting portion 19e from gas and/or plasma around the heater 1.

Further, in the present embodiment, the internal conductors (resistance heating elements 27) and the relay conductors 29 are connected through the intermediate layers 37 (FIG. 5C). The intermediate layers 37 are made of a material containing the same constituents (for example AlN) as that of the material of the plate-shaped part 23 and the same constituents (for example W) as that of the material of the resistance heating elements 27.

In this case, for example, even at the time when gaps are formed between the resistance heating elements 27 and the relay conductors 29, the two can be electrically connected by the intermediate layers 37 (conductive paste) positioned in the gaps. That is, the reliability of electrical connection is improved. Further, the intermediate layers 37 are made of material containing the same constituents as those of the materials of the resistance heating element 27 and plate-shaped part 23, therefore the strength relating to coupling (fixation) of the two is improved. According to this as well, the reliability of the electrical connection is improved.

Further, in the present embodiment, a first example of the method for manufacturing the heater 1 has the following steps: the step (ST2) of using the ceramic material to prepare the first shaped member (columnar body 19 before firing) including the columnar part 25, the step (ST3) of inserting the relay conductors 29 into the first shaped member, the step (ST4) of firing the first shaped member in which the relay conductors 29 are inserted to obtain a sintered body (columnar body 19 after firing), the step (ST1) of using the ceramic material to prepare the second shaped member (plate-shaped body 17 before firing) which is shaped forming the recessed portion 17r in the lower surface 17b of the plate-shaped part 23 and in which the conductive paste for forming the internal conductors (resistance heating elements 27) is buried, and the step (ST6 and ST7) of inserting a portion (projecting portion 19e) of the sintered body into the recessed portion 17r in the second shaped member, then firing to thereby obtain the joined member (combination of the plate-shaped body 17 and the columnar body 19).

In this case, for example, the simple and convenient method of inserting the relay conductors 29 into the first shaped member can be used to realize the heater 1 having the relay conductors 29 extending in the columnar part 25. Further, the plate-shaped body 17 and the columnar body 19 are joined by firing, therefore the joining strength of the two can be improved. As already explained, by fastening the projecting portion 19e by the plate-shaped body 17, the joining strength can be further improved.

Further, in the present embodiment, the second example of the method for manufacturing the heater 1 has the following steps: the step (ST2) of using the ceramic material to prepare the first shaped member (columnar body 19 before firing) including the columnar part 25, the step (ST3) of inserting the relay conductors 29 into the first shaped member, the step (ST4) of firing the first shaped member in which the relay conductors 29 are inserted to thereby obtain a first sintered body (columnar body 19 after firing), the step (ST1) of using the ceramic material to prepare the second shaped member (plate-shaped body 17 before firing) which is shaped forming the recessed portion 17r in the lower surface 17b of the plate-shaped part 23 and in which the conductive paste for forming the internal conductors (resistance heating elements 27) is buried, the step (ST11) of firing the second shaped member to obtain a second sintered body (plate-shaped body 17 after firing), and the step (ST12 and ST13) of inserting a portion (projecting portion 19e) of the first sintered body into the recessed portion 17r in the second sintered body and bonding the two to thereby obtain the joined member (combination of the plate-shaped body 17 and the columnar body 19).

In this case, for example, in the same way as the first example, a simple and convenient method of inserting the relay conductors 29 into the first shaped member can be used to realize the heater 1 having the relay conductors 29 extending in the columnar part 25. Further, the two of the plate-shaped body 17 and the columnar body 19 are respectively prepared, then the two are joined. Therefore, for example, the plate-shaped body 17 and the columnar body 19 can be stored for a long period of time up to before bonding. That is, the degree of freedom of the manufacturing process is improved.

Further, in the present embodiment, at step (ST3) of inserting the relay conductors 29 into the first shaped member (columnar body 19 before firing), the relay conductors 29 are inserted into the first shaped member so that the single ends (upper ends) of the relay conductors 29 project from the upper surface of the first shaped member. At step (ST1) of preparing the second shaped member (plate-shaped body 17 before firing), holes 17s (FIG. 5C) are formed in the recessed portion 17r. At step (ST6 or ST12) of obtaining the joined member (combination of the plate-shaped body 17 and the columnar body 19), single ends of the relay conductors 29 are inserted into the holes 17s.

In this case, for example, the plate-shaped body 17 and the columnar body 19 can be positioned by the upper ends of the relay conductors 29 and the holes 17s. Further, for example, in a case where provision is made of conductive paste for forming the intermediate layers 37, the probability of the conductive paste expanding to cause short-circuiting of the relay conductors 29 with each other can be lowered. As a result, arrangement of a relatively large amount of conductive paste is facilitated. In turn, even if the processing precision of the projecting portion 19e and the recessed portion 17r is low, the reliability of the electrical connection between the relay conductors 29 and the resistance heating elements 27 can be improved.

Second Embodiment

Figure 9:
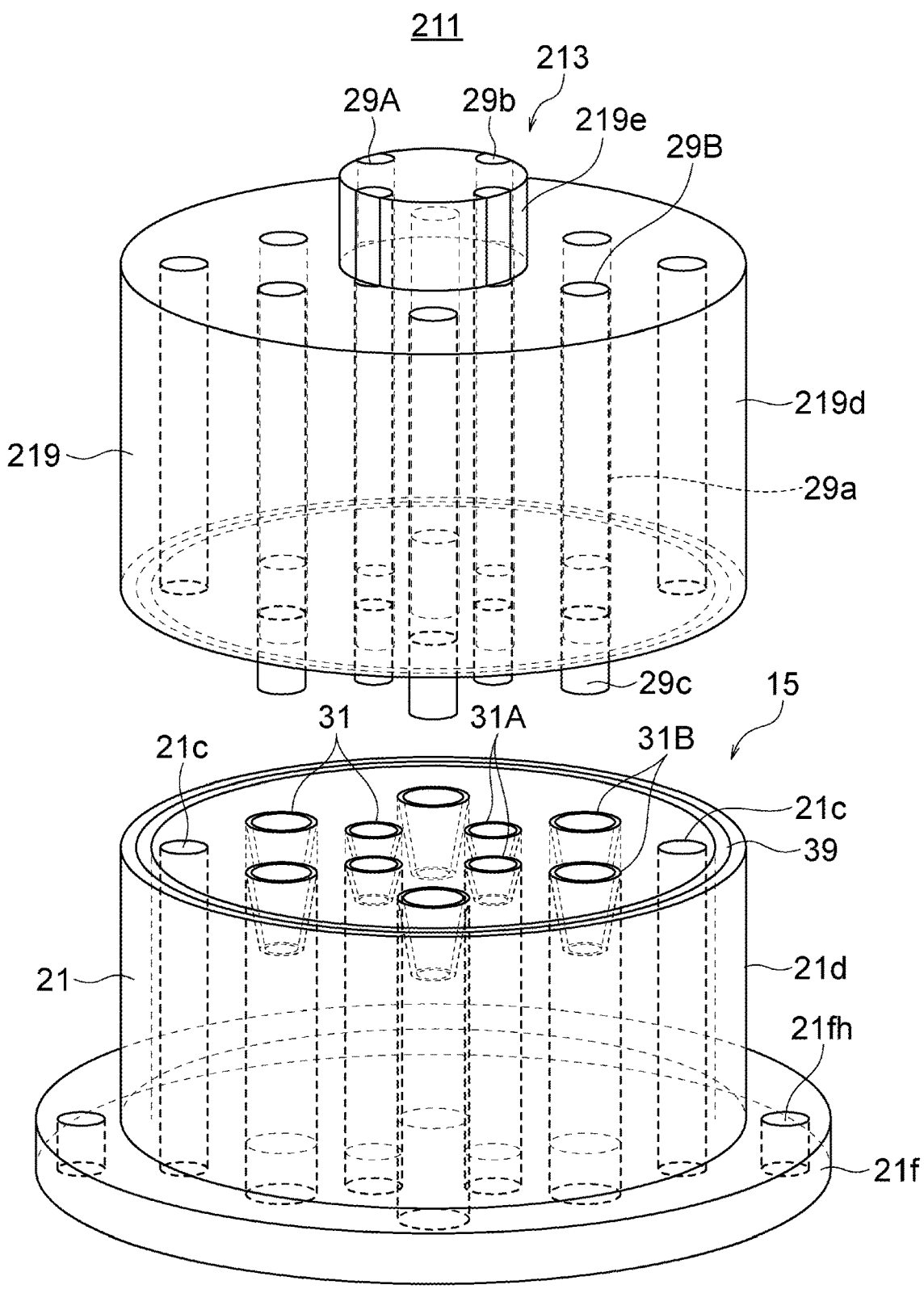
FIG. 9 is a disassembled perspective view showing the configuration of a heater pillar in a heater according to a second embodiment.
Figure 10A:
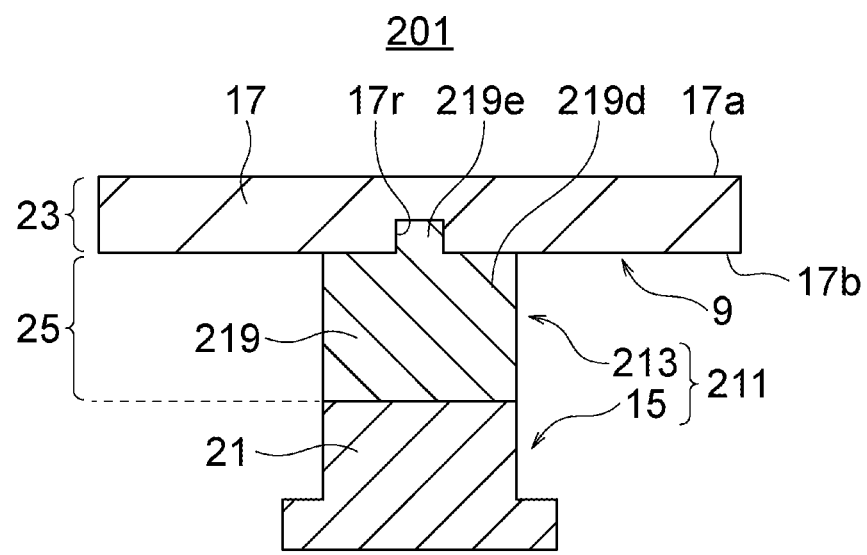
FIG. 10A and FIG. 10B are cross-sectional views showing one example and another example of joining a plate-shaped body and a columnar body in the heater in FIG. 9.

FIG. 9 is a disassembled perspective view showing the configuration of a heater pillar 211 in a heater 201 (notation is shown in FIG. 10A) according to a second embodiment and corresponds to FIG. 2 for the first embodiment.

The heater pillar 211, in short, is one configuring the projecting portion 19e by only the small-diameter portion 19n in the columnar body 19 of the first embodiment. That is, a columnar body 219 in an upper pillar 213 in the present embodiment has a column main body 219d and a projecting portion 219e which projects from the upper surface of the column main body 219*d*. The projecting portion 219*e* does not have multiple stages as in the first embodiment, but has one stage.

A plurality of relay conductors 29A, in the same way as the first embodiment, extend in the vertical direction in the column main body 219*d* and the projecting portion 219*e* and are exposed at the side surface of the projecting portion 219*e*. Also, the shapes of the relay conductors 29A are the same as the shapes of the relay conductors 29A in the first embodiment. On the other hand, unlike the first embodiment, a plurality of relay conductors 29B extend in the vertical direction in only the column main body 219*d* (do not extend in the projecting portion 219*e*) and have upper ends exposed from the upper surface of the column main body 219*d*. Note that, the upper ends of the relay conductors 29B may project from the upper surface of the column main body 219*d* or may not project. Further, in the present embodiment, the relay conductors 29B extend from the upper ends to the lower ends with constant transverse cross-sections (circular in the example shown).

FIG. 10A is a cross-sectional view showing an example of joining the plate-shaped body 17 and the column main body 219 and substantially corresponds to FIG. 1B for the first embodiment. In this example, the projecting portion 219*e* is inserted in the recessed portion 17*r* in the plate-shaped body 17, and the upper surface of the column main body 219*d*, in the same way as the first embodiment, faces the lower surface 17*b* of the plate-shaped body 17. In this case, the plate-shaped body 17 and the projecting portion 219*e* configure the plate-shaped part 23, and the column main body 219*d* configures the columnar part 25. The connection between the relay conductors 29A and the resistance heating elements 27 may be made the same as the first embodiment. The relay conductors 29B are for example connected in their upper surfaces with not shown conductors which extend from the positions of the resistance heating elements 27 up to the lower surface 17*b* inside the plate-shaped body 17 directly or through the intermediate layers 37 (see FIG. 5C). In a case where the upper ends of the relay conductors 29B project from the upper surface of the column main body 219*d*, the side surfaces of the upper ends and the resistance heating elements 27 may be connected directly or through the intermediate layers 37.

Figure 10B:
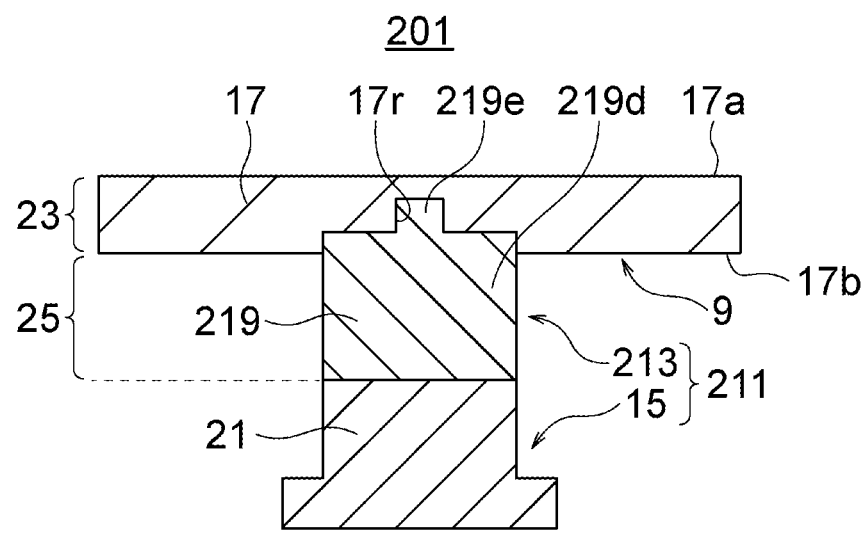

FIG. 10B is a cross-sectional view showing another example of joining the plate-shaped body 17 and the columnar body 219 and substantially corresponds to FIG. 1B for the first embodiment. In this example, the projecting portion 219*e* and a portion of the column main body 219*d* on the upper side are inserted in the recessed portion 17*r* in the plate-shaped body 17. In this case, the plate-shaped body 17, the projecting portion 219*e*, and the portion of the column main body 219*d* on upper side configure the plate-shaped part 23, and the portion of the column main body 219*d* on the lower side configures the columnar part 25. The relay conductors 29A and the resistance heating elements 27 may be connected in the same as the first embodiment. The relay conductors 29B are for example connected at their upper surfaces with the resistance heating elements 27 directly or through the intermediate layers 37 (see FIG. 5C). In a case where the upper ends of the relay conductors 29B project from the upper surface of the column main body 219*d*, the side surfaces of the upper ends and the resistance heating elements 27 may be connected directly or through the intermediate layers 37. Note that, not shown conductors which extend from the resistance heating elements 27 toward the upper surfaces of the relay conductors 29B in the plate-shaped body 17 may be interposed between the resistance heating elements 27 and the relay conductors 29B as well.

As explained above, in the heater 201 according to the present embodiment as well, the plurality of relay conductors 29 respectively have extension portions 29*a* vertically extending in the columnar part 25 and are electrically connected to the resistance heating elements 27. Accordingly, the same effects as those by the first embodiment are exhibited. For example, protection of the wirings (relay conductors 29) from the gas and/or plasma around the heater is facilitated.

Third Embodiment

Figure 11A:
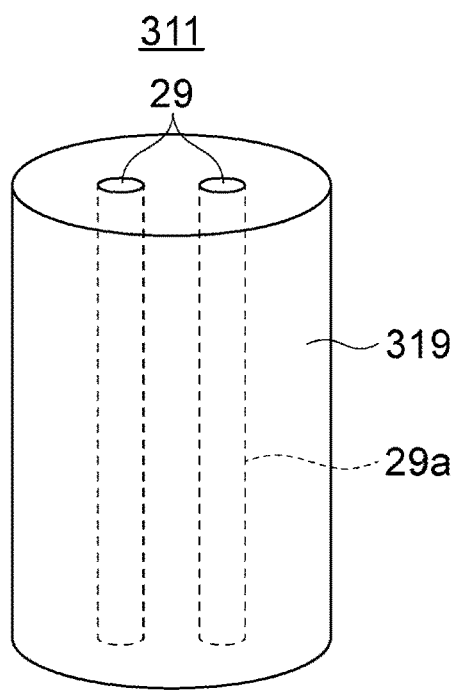
FIG. 11A, FIG. 11B, and FIG. 11C are views showing the configuration of a heater according to a third embodiment.
Figure 11B:
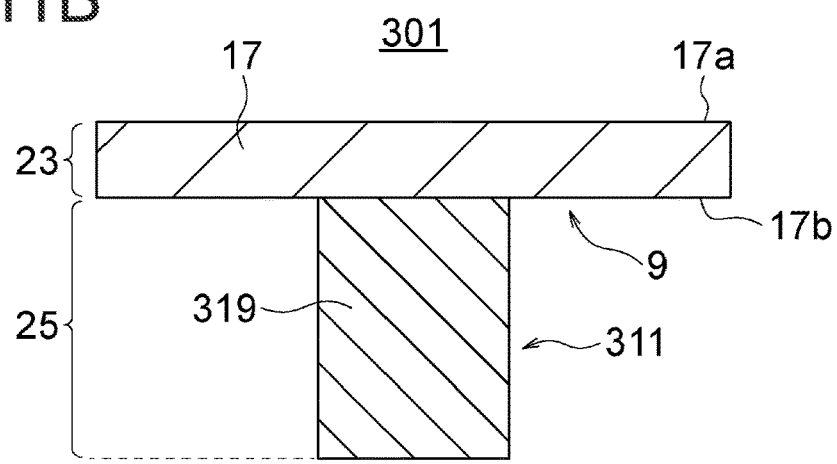

FIG. 11A is a perspective view showing the configuration of a heater pillar 311 in a heater 301 (notation is shown in FIG. 11B) according to a third embodiment.

The heater pillar 311, in short, is one obtained by simplifying the heater pillar 11 in the first embodiment as much as possible. Specifically, the heater pillar 311 does not have a configuration divided into the upper pillar and the lower pillar. Further, a columnar body 319 in the heater pillar 311 does not have the projecting portion 19*e* in the first embodiment. In other words, the columnar body 319 is configured by just the column main body 19*d* in the first embodiment. The relay conductors 29, in the same way as the relay conductors 29B in the second embodiment, are exposed at their upper end surfaces from the upper surface of the columnar body 319. The positions of the upper ends of all of the relay conductors 29 are for example the same as each other since no projecting portion is provided. The upper ends of the relay conductors 29 may project from the upper surface of the columnar body 319 or may not project from it.

Note that, whether the positions of the upper ends of the relay conductors 29 are the same as each other may be rationally judged based on the thickness of the heater plate 9 and the like. For example, the "same" may be judged in a case where a difference of positions in the vertical direction of the upper ends of the relay conductors 29 is ½ or less or ¹⁄₁₀ or less of a distance from the lower surface 17*b* of the plate-shaped part 23 up to the internal conductor (resistance heating element 27) closest to the lower surface 17*b*. Further, the "same" may be so judged when the above difference is 1 mm or less or 0.1 mm or less.

FIG. 11B is a cross-sectional view showing an example of joining the plate-shaped body 17 and the columnar body 319 and substantially corresponds to FIG. 1B for the first embodiment. In this example, the upper surface of the columnar body 319 faces the lower surface 17*b* of the plate-shaped body 17. In this case, the plate-shaped body 17 configures the plate-shaped part 23, and the columnar body 319 configures the columnar part 25. The relay conductors 29 and the resistance heating elements 27 may be connected in the same way as the connection between the relay conductors 29B and the resistance heating elements 27 in the example in FIG. 10A in the second embodiment.

Figure 11C:
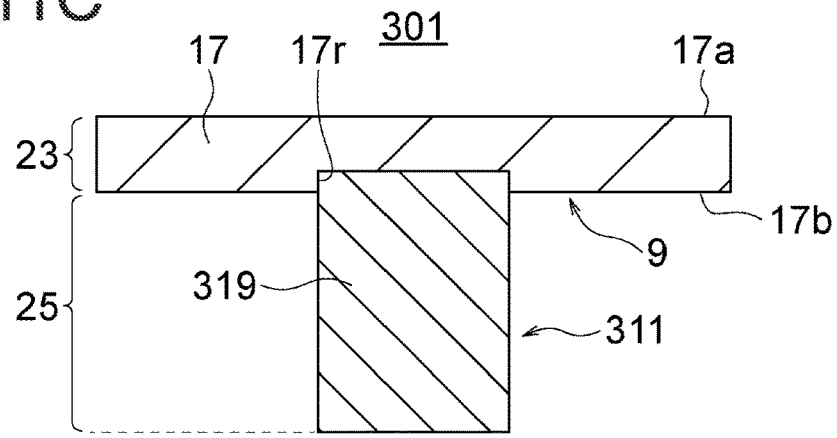

FIG. 11C is a cross-sectional view showing another example of joining the plate-shaped body 17 and the columnar body 319 and substantially corresponds to FIG. 1B for the first embodiment. In this example, a portion of the columnar body 319 on the upper side is inserted in the recessed portion 17*r* in the plate-shaped body 17. In this case, the plate-shaped body 17 and the portion of the columnar body 319 on the upper side configure the plate-shaped part 23, and a portion of the columnar body 319 on the lower side configures the columnar part 25. The relay conductors 29 and the resistance heating elements 27 may be connected in the same way as the connection between the relay conductors 29B and the resistance heating elements 27 in the example in FIG. 10B for the second embodiment.

As explained above, even in the heater 301 according to the present embodiment, the plurality of relay conductors 29 respectively have extension portions 29a (entireties of the relay conductors 29 in the example shown) vertically extending in the columnar part 25 and are electrically connected to the resistance heating elements 27. Accordingly, the same effects as those by the first embodiment are exhibited. For example, the protection of the wirings (relay conductors 29) from the gas and/or plasma around the heater is facilitated. Further, the present embodiment is simple in configuration compared with the other embodiments.

[Modifications]

(Modification of Columnar Part)

Figure 14:
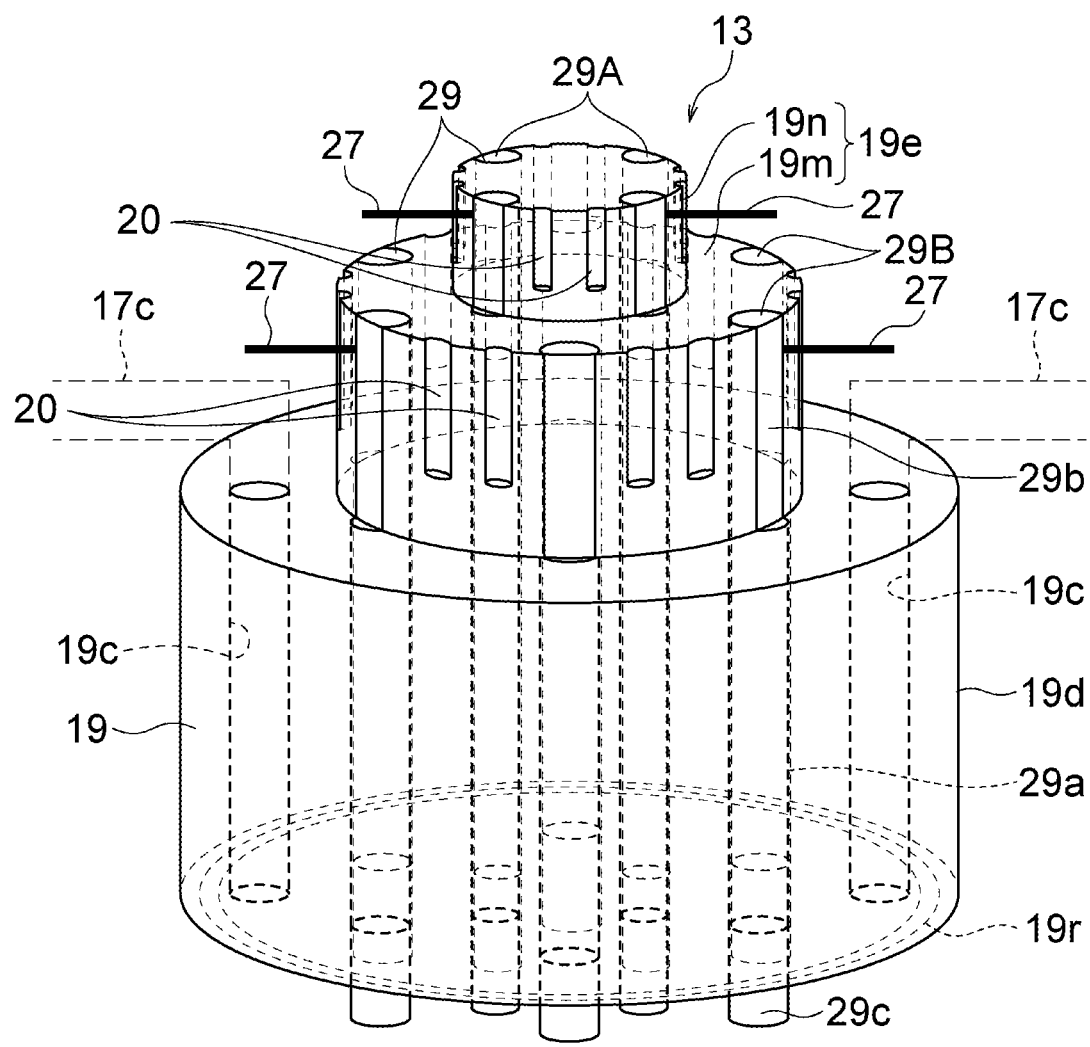
FIG. 14 is a perspective view showing a modification of the upper pillar.

FIG. 14 is a perspective view showing a modification of the heater pillar 11 (in more detail, the upper pillar 13) and corresponds to a portion in FIG. 2.

The columnar body 19 in the upper pillar 13 has recessed portions 20 in an outer circumferential surface of the projecting portion 19e. Due to this, for example, in the manufacturing process, the probability that a material having fluidity which is present between the projecting portion 19e and the recessed portion 17r in the plate-shaped body 17 in which the projecting portion 19e is inserted will end up expanding up to an unintended region is reduced.

More specifically, for example, FIG. 5C showed a modification in which provision was made of the intermediate layers 37 between the relay conductors 29 (in more detail, the connection portions 29b) in the upper pillar 13 and the resistance heating elements 27. The intermediate layers 37 are for example prepared by coating a conductive paste for forming the intermediate layers 37 on the connection portions 29b, inserting the projecting portion 19e into the recessed portion 17r next, then firing these. In this case, when the projecting portion 19e is inserted into the recessed portion 17r, surplus conductive paste is stored in the recessed portion 17r. As a result, the probability that the conductive paste will unnecessarily expand to the inner circumferential surface and bottom surface of the recessed portion 17r is reduced. Accordingly, for example, the probability of the conductive paste coated on the connection portions 29b contacting other connection portions 29b or the conductive paste coated on the other connection portions 29b is reduced. In turn, short-circuiting of the plurality of connection portions 29b with each other is reduced.

The shapes and sizes of the recessed portions 20 may be suitably set. In the example shown, the recessed portions 20 are groove shaped so as to extend in the vertical direction (shapes where lengths in the vertical direction are longer than lengths in the horizontal direction (widths)) in the outer circumferential surfaces of the projecting portion 19e (in more detail, the large-diameter portion 19m and small-diameter portion 19n). Further, the upper ends of the recessed portions 20 reach the upper surfaces of the large-diameter portion 19m and small-diameter portion 19n, therefore the recessed portions 20 become notch states. Further, the lengths in the vertical direction of the recessed portions 20 provided in the large-diameter portion 19m are half of the length in the vertical direction of the large-diameter portion 19m or more. In the same way, the lengths in the vertical direction of the recessed portions 20 provided in the small-diameter portion 19n are half of the length in the vertical direction of the small-diameter portion 19n or more. The depths of the recessed portions 20 from the outer circumferential surface of the projecting portion 19e are shallower than the embedded depths of the relay conductors 29 from the outer circumferential surface of the projecting portion 19e. The shapes of the transverse cross-sections of the grooves are semicircular shapes.

If the shapes of the recessed portions 20 are the shapes as in the example shown, for example, even if conductive paste is coated over relatively long ranges of the upper end sides of the connection portions 29b, the probability of expansion of surplus conductive paste in the circumferential direction of the projecting portion 19e can be reduced. Since the conductive paste can be coated over relatively vertically long ranges, the conductive paste can be reliably made to contact the resistance heating elements 27 which are present at specific positions in the vertical direction. On the other hand, the recessed portions 20 have elongated shapes, therefore the strength of the projecting portion 19e is maintained.

Naturally, unlike the example shown, the recessed portions 20 may have shapes in which the lengths and the widths are equal as well. The recessed portions 20 may have deeper depths than the embedded depths of the relay conductors 29 as well. The recessed portions 20 need not reach the upper surface of the large-diameter portion 19m or small-diameter portion 19n either. The transverse cross-sections of the recessed portions 20 may be rectangular. The groove-shaped recessed portions 20 may extend in a direction inclined in the vertical direction or may be curved.

The positions and number of the recessed portions 20 may be suitably set as well. In the example shown, for all connection portions 29b, two each recessed portions 20 are provided between two connection portions 29b neighboring each other in the circumferential direction of the projecting portion 19e. In such an arrangement, the conductive paste expanded from one connection portion 29b enters into the recessed portion 20 between the two recessed portions 20 which is closer to the one connection portion 29b. In the same way, the conductive paste expanded from the other connection portion 29b enters into the recessed portion 20 between the two recessed portions 20 which is closer to the other connection portion 29b. That is, the conductive pastes which spread from the two mutually neighboring connection portions 29b enter into the mutually different recessed portions 20. Accordingly, the probability of the conductive pastes contacting each other is reduced.

Naturally, unlike the example shown, the recessed portions 20 may be provided one each between two mutually neighboring connection portions 29b as well. The recessed portions 20 need not be provided for all connection portions 29b and may be provided only for some of the connection portions 29b. For example, among the plurality of connection portions 29b, the recessed portions 20 need not be provided for some of the connection portions 29b having relatively long distances up to the neighboring connection portions 29b. The distances between the connection portions 29b and the recessed portions 20 and the distances between the recessed portions 20 may be suitably set.

The recessed portions 20 were explained from the viewpoint of the columnar body 19. However, in the completed heater 1, sometimes identification of the boundary between the columnar body 19 and the plate-shaped body 17 is difficult. Here, as already explained, when viewed on a plane, the plurality of connection portions 29b may be positioned on the circumference having the center C1 of the columnar part 25 as the center. Further, the recessed portions 20 are designed in their sizes so as not to be filled up by the conductive pastes forming the intermediate layers 37 and the like. Accordingly, for example, when observing the completed heater 1, if a space is positioned between the mutually neighboring connection portions 29*b* on a circumference having the center C1 as the center, this space may be identified as part or all of a recessed portion 20. The space is sealed with a gas or rendered a vacuum state.

Here, the explanation was given taking the first embodiment as an example. However, the recessed portions 20 may be applied to the second embodiment and other embodiments as well. Further, the recessed portions 20 may be provided not at the outer circumferential surfaces of the projecting portion, but may be provided on the upper surface of the projecting portion or may be provided at the inner circumferential surface or bottom surface of the recessed portion 17*r* in which the projecting portion is inserted.

(Modification of Coupling Structure of Upper Pillar and Lower Pillar)

Figure 12:
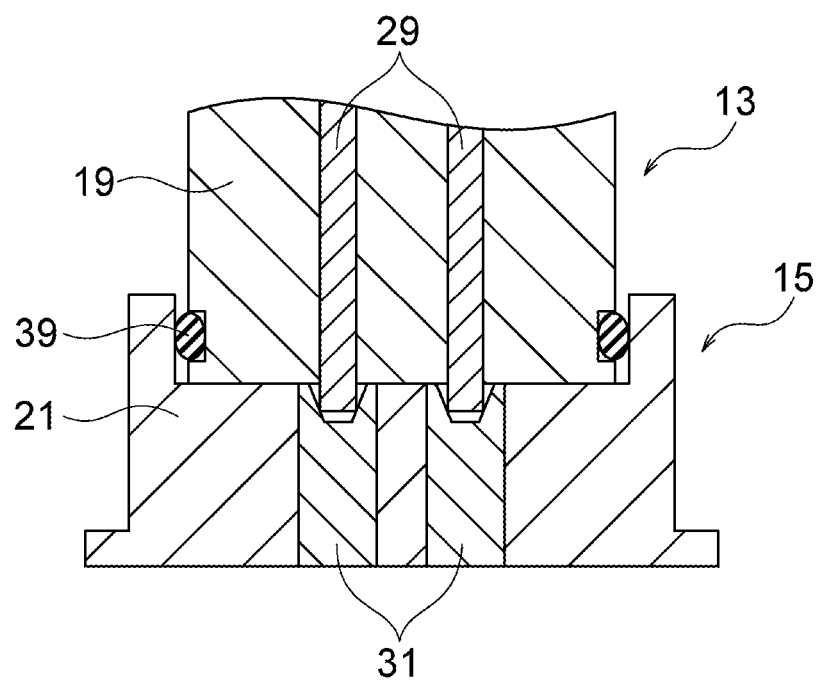
FIG. 12 is a cross-sectional view showing a modification of a connection structure of the upper pillar and the lower pillar.

FIG. 12 is a cross-sectional view showing a modification of a coupling structure of the upper pillar 13 (may be 213 as well) and the lower pillar 15.

As shown in this view, the lower part of the columnar body 19 may be inserted (fit) in a recessed portion (notation is omitted) formed in the upper surface of the lower base body 21 to thereby couple the two. Further, in this case, packing 39 may be interposed between the side surface of the columnar body 19 and the side surface of the recessed portion in the lower base body 21 as well.

In such a structure, the packing 39 first contributes to sealing a part between the columnar body 19 and the lower base body 21. Further, the packing 39 is pushed against the columnar body 19 and lower base body 21 due to its elastic force (restoring force) to generate resistance against force acting to pull the columnar body 19 out of the recessed portion in the lower base body 21, therefore also contributes to the strengthening of the mechanical connection of the columnar body 19 and the lower base body 21.

As will be understood from the present modification, the region in the columnar body 19 concealed by the lower base body 21 (from another viewpoint, the sealed region) is not limited to the lower surface of the columnar body 19 and may be the side surface on the lower side of the columnar body 19 as well. Further, by bending the relay conductors 29 or the like, single ends of the relay conductors 29 may be exposed in the regions which are positioned in the side surface of the columnar body 19 and sealed as well.

[Examples of Patterns of Resistance Heating Elements]

Figure 13A:
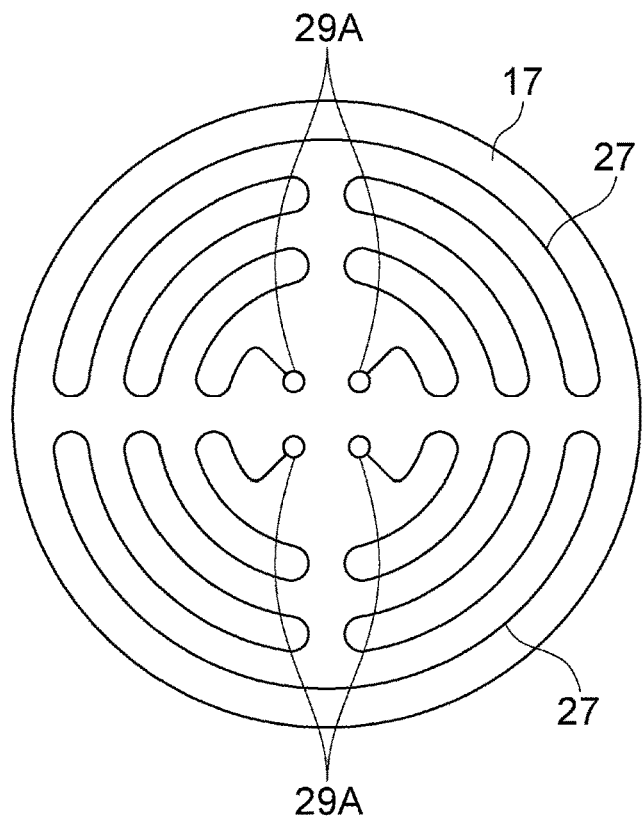
FIG. 13A and FIG. 13B are plan views showing examples of patterns of resistance heating elements.
Figure 13B:
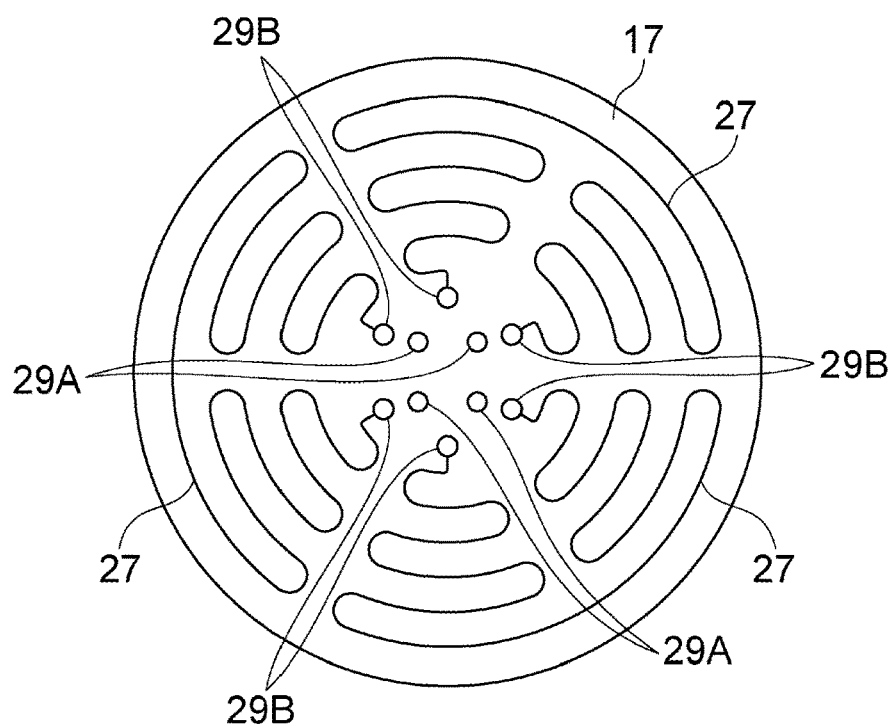

FIG. 13A and FIG. 13B are plan views showing examples of patterns of the resistance heating elements 27. FIG. 13A shows the resistance heating elements 27 connected to the relay conductors 29A. FIG. 13B shows the resistance heating elements 27 connected to the relay conductors 29B. That is, FIG. 13A shows the upper layer of the resistance heating elements 27, and FIG. 13B shows the lower layer of the resistance heating elements 27.

In FIG. 13A, in each of the regions obtained by dividing the plate-shaped body 17 into two, one resistance heating element 27 extends in a state meandering along the circumferential direction. That is, two resistance heating elements 27 in total extend. To the two ends of each resistance heating element 27, two relay conductors 29A are connected. That is, four relay conductors 29A in total are connected to the two resistance heating elements 27. The resistance heating elements 27 are positioned on the outer edge side of the plate-shaped body 17 relative to the relay conductors 29A. Note that, the two resistance heating elements 27 may be connected to each other as well.

In FIG. 13B, in each of the regions obtained by dividing the plate-shaped body 17 into three, one resistance heating element 27 extends in a state meandering along the circumferential direction. That is, three resistance heating elements 27 in total extend. To the two ends of each resistance heating element 27, two relay conductors 29B are connected. That is, six relay conductors 29B in total are connected to the three resistance heating elements 27. The resistance heating elements 27 are positioned on the outer edge side of the plate-shaped body 17 relative to the relay conductors 29B. The relay conductors 29A are positioned on the inner side of the six relay conductors 29B. Note that, the three resistance heating elements 27 may be connected to each other as well.

When the resistance heating elements 27 are provided by such patterns, for example, by individually controlling the voltages to be supplied to the plurality of resistance heating elements 27, a temperature difference between the regions of the plate-shaped body 17 can be reduced or enlarged.

[One Example of Material of Heater]

As already explained, both of the material of the plate-shaped body 17 in the heater plate 9 and the material of the columnar body 19 in the upper pillar 13 may be made ceramic. Further, the materials of the two (or their principal constituents) may be the same or may be different. Here, one example of a case where the material of the plate-shaped body 17 and the material of the columnar body 19 are ceramics which are the same in the entireties of their constituents or in the principal constituents will be explained. Note that, here, use is made of the notations in the first embodiment. However, the example of the materials here may be applied to the second embodiment and other embodiments as well.

Figure 15A:
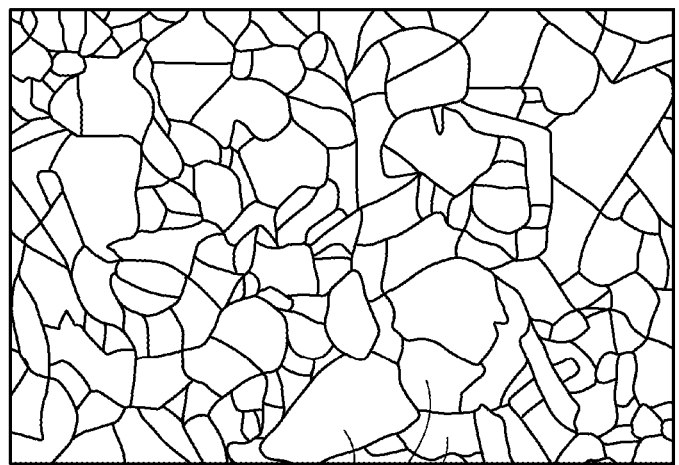
FIG. 15A and FIG. 15B are cross-sectional views showing examples of the material of the heater.
Figure 15B:
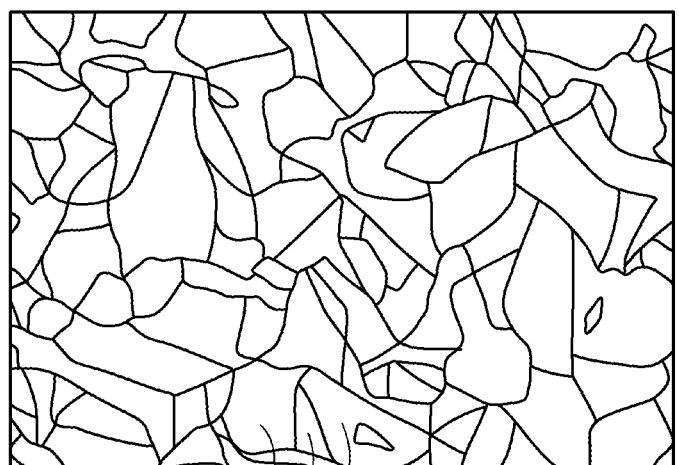

FIG. 15A is a cross-sectional view of a portion in the plate-shaped body 17. FIG. 15B is a cross-sectional view of a portion in the columnar body 19. These cross-sectional views show for example ranges where one side becomes 50 μm to 200 μm. Pluralities of grains Gr (single crystal grains, ceramic particles) are shown. From another viewpoint, the grain boundaries are shown.

As shown in these views, the mean value of crystal grain sizes (mean grain size) of the columnar body 19 may be made larger than the mean value of crystal grain sizes in the plate-shaped body 17. In this case, for example, the larger the crystal grain size of the ceramic, the larger the Young's modulus. Therefore, the strength of the columnar body 19 can be made high. As a result, for example, the probability of occurrence of cracks in the columnar body 19 when a bending moment is applied to the columnar body 19 can be reduced.

The constituents and mean grain size of the ceramic in such an aspect may be suitably set. For example, the principal constituent of the ceramic may be made aluminum nitride (AlN). The mean grain size in the plate-shaped body 17 may be made for example 3 μm to 8 μm. The mean grain size in the columnar body 19 may be made for example 5 μm to 12 μm (however, larger than the mean grain size in the plate-shaped body 17). The plate-shaped body 17 and the columnar body 19 may include sintering aids which are the same or contain the same principal constituents. The element configuring the sintering aid may be made for example yttrium (Y).

Note that, the mean grain size may be measured by a suitable method. One example will be shown below. The means of circle equivalent diameters of the crystals in the principal constituents (for example AlN) of the plate-shaped body 17 and columnar body 19 will be regarded as the mean grain sizes. The circle equivalent diameters are measured as follows. First, the respective cross-sections of the plate-shaped body 17 and columnar body 19 are machined to mirror surfaces. The machined cross-sections are photographed by an SEM (scanning electron microscope). The magnification at this time is made substantially 1000 times to 3000 times. Further, the projection area is made 1000 $\mu m^2$ to 20000 $\mu m^2$. Next, in the photographed images, profiles of the crystals of the principal constituents are drawn by tracing by black lines. At this time, when sintering aids are contained, the crystals containing the sintering aids are colored black. The traced images are analyzed by using a procedure such as particle analysis of an image analyzing software "Azokun" (trademark, made by Asahi Kasei Engineering Corporation). By this analysis, the means of circle equivalent diameters of the particles are obtained.

The method of making the mean grain size in the columnar body 19 larger than the mean grain size in the plate-shaped body 17 may be made a suitable one. For example, the number of times of firing the columnar body 19 may be made larger than the number of times of firing the plate-shaped body 17 and/or the time of firing the columnar body 19 may be made longer than the time of firing the plate-shaped body 17. Note that, in the manufacturing method explained with reference to FIG. 7, contrast to the plate-shaped body 17 was only fired together with the columnar body 19 (step ST7), the columnar body 19 is fired solely as well (step ST4), therefore the grain size of the columnar body 19 is apt to become larger than the grain size of the plate-shaped body 17.

In the above embodiments and modifications, each of the heaters 1, 201, and 301 is one example of a wafer-use member. The heater system 101 is one example of a wafer-use system. The resistance heating element 27 is one example of an internal conductor. The relay conductor 29A is one example of a first relay conductor. The relay conductor 29B is one example of a second relay conductor. The plate channel 17c is one example of a first channel. The upper channel 19c is one example of a second channel. The bonding material 33 is one example of a sealing agent layer. The plate-shaped body 17 before firing is one example of a second shaped member. The plate-shaped body 17 after firing is one example of a second sintered body. The columnar body 19 before firing is one example of a first shaped member. The columnar body 19 after firing is one example of a sintered body or first sintered body. A combination of the plate-shaped body 17 after firing and the columnar body 19 after firing are one example of a joined member.

The heater according to the present disclosure is not limited to the above embodiments and may be realized in various ways.

The embodiments and modifications etc. explained above may be suitably combined. For example, the configuration in the third embodiment in which the columnar body does not have a projecting portion and the configuration in the first and second embodiments in which provision is made of the lower pillar may be combined as well. Further, for example, in a case as shown in the first embodiment where the columnar body 19 has a multi-stage projecting portion 19e, as in the example in FIG. 10B, a portion in the upper part of the column main body 19d may be inserted in the recessed portion 17r in the plate-shaped body 17 as well.

In the embodiments, as the wafer-use member, ceramic heaters having heating functions were taken as examples. However, the wafer-use member may be a member having other functions as well. For example, the wafer-use member may be an electrostatic chuck or plasma generation-use structure, or may be function as a combination of any selected two or more of these structures and heaters as well.

In other words, the internal conductors were heating-use resistance heating elements in the embodiments. However, the internal conductors may be conductors for other purposes. For example, the internal conductors may be electrostatic chuck-use electrodes or plasma generation-use electrodes. The wafer-use member may have one of these electrodes and resistance heating element or a combination of two or more selected from among them. The internal conductors are for example conductors which may have, as the entirety, shapes that expand along the upper surface of the plate-shaped part (face the upper part). Further, for example, when assuming the minimum convex curve surrounding the internal conductors as a whole when viewed on a plane, the region surrounded by the convex curve occupies 60% or more or 80% or more of the upper surface of the plate-shaped part.

The lower base body in the lower pillar may be made for example a pipe shape having a closed upper end as well. Terminals which are exposed in the upper part of the pipe and inside the pipe may be provided at the upper end of the pipe, and the relay conductors in the upper pillar may be connected to these terminals. In the pipe, wiring conductors which are connected to the terminals may be arranged. These wiring conductors may be rod-shaped conductors or may be conductors having flexibility.

REFERENCE SIGNS LIST

1 . . . heater (wafer-use member), 17 . . . plate-shaped body, 17a . . . upper surface, 17b . . . lower surface, 23 . . . plate-shaped part, 25 . . . columnar part, 27 . . . resistance heating element (internal conductor), 29 . . . relay conductor, and 29a . . . extension portion.

The invention claimed is:

1. A wafer-use member comprising:
   an insulating plate-shaped part comprising an upper surface on which a wafer is to be superimposed and a lower surface on an opposite side to the upper surface;
   one or more internal conductors which are buried in the plate-shaped part;
   an insulating columnar part which projects downward from the lower surface of the plate-shaped part; and
   a plurality of relay conductors which respectively comprises extension portions vertically extending inside the columnar part and which are electrically connected to the one or more internal conductors, wherein
   at least one of the plurality of relay conductors further comprises a connection portion which extends from the extension portion to an internal portion of the plate-shaped part;
   the internal conductor and the connection portion are joined at a side surface or end surface of the connection portion; and
   when viewed on a plane, the connection portion is set away from a center of the columnar part and is shaped as a circular shape from which a portion on an opposite side to the center is removed.

2. The wafer-use member according to claim 1, wherein when viewed on a plane, the connection portion is shaped as the circular shape from which the portion on the opposite side to the center is removed by using an arc as a boundary, the arc having a smaller curvature than that of a circumference of the circular shape and having a center side of the circular shape as its center side of curvature.

3. The wafer-use member according to claim 1, wherein
two or more relay conductors respectively comprises the
connection portions, and,
when viewed on a plane, the connection portions of the
two or more relay conductors are located on a same
circumference having the center of the columnar part as
its center.

4. The wafer-use member according to claim 3, wherein,
when viewed on a plane, the connection portions of the two
or more relay conductors are point symmetrically arranged
with respect to the center of the circumference.

5. The wafer-use member according to claim 4, wherein
the plate-shaped part comprises a space between mutually
neighboring connection portions on the circumference.

6. The wafer-use member according to claim 1, wherein
the pluralities of relay conductors comprises
first relay conductors, and
second relay conductors which are set further away
from a center of the columnar part than the first relay
conductors when viewed on a plane and comprises
upper ends located lower than the upper ends of the
first relay conductors.

7. The wafer-use member according to claim 1, wherein
positions of upper ends of all of the plurality of relay
conductors are the same as each other.

8. The wafer-use member according to claim 1, further
comprising:
an insulating lower base body which is fixed to a lower
part of the columnar part; and
a lower conductor which is buried in the lower base body
and is electrically connected with the relay conductor.

9. The wafer-use member according to claim 8, wherein
the relay conductor is exposed from the columnar part in a
region in the surface of the columnar part which is concealed
from an exterior by the lower base body whereby the relay
conductor is electrically connected with the lower conductor.

10. The wafer-use member according to claim 9, wherein
the relay conductor comprises a projecting portion which
projects from a lower surface of the columnar part, and
the lower conductor is exposed from an upper surface of
the lower base body and comprises a recessed portion
in which the projecting portion is inserted.

11. The wafer-use member according to claim 1, wherein
the plate-shaped part comprises a first channel, and
the columnar part comprises a second channel which is
communicated with the first channel.

12. The wafer-use member according to claim 1, further
comprising a sealing agent layer which is located at least
either of a portion between the plate-shaped part and the
columnar part and an internal portion of the plate-shaped
part, which is made of a material different from materials of
both of the plate-shaped part and the columnar part, and
which surrounds a predetermined position in a vertical
direction of at least one of the plurality of relay conductors
when viewed on a plane.

13. The wafer-use member according to claim 1, wherein
the internal conductor and the relay conductor are connected
through an intermediate layer which is made of a material
containing a same constituent as that of a material of the
plate-shaped part and a same constituent as that of a material
of the internal conductor.

14. The wafer-use member according to claim 1, further
comprising:
a plate-shaped body which configures at least a portion of
the plate-shaped part; and
a columnar body which configures the columnar part,
wherein
the plate-shaped body and the columnar body are made of
ceramics which are same in principal constituents as
each other, and a mean crystal grain size of the columnar part is larger than a mean crystal grain size of the
plate-shaped body.

15. A wafer-use system comprising:
the wafer-use member according to claim 1,
a power supply part which is electrically connected to the
relay conductor, and
a control part which controls the power supply part.

16. A method of manufacturing a wafer-use member
having an insulating plate-shaped part comprising an upper
surface on which a wafer is to be superimposed and a lower
surface on an opposite side to the upper surface; one or more
internal conductors which are buried in the plate-shaped
part; an insulating columnar part which projects downward
from the lower surface of the plate-shaped part; and a
plurality of relay conductors which respectively comprises
extension portions vertically extending inside the columnar
part and which are electrically connected to the one or more
internal conductors, the method comprising:
a step of preparing a first shaped member including the
columnar part by using a ceramic material;
a step of inserting the relay conductor into the first shaped
member;
a step of obtaining a sintered body by firing the first
shaped member in which the relay conductor was
inserted;
a step of preparing a second shaped member by using a
ceramic material, the second shaped member comprising a shape of the plate-shaped part with a recessed
portion in a lower surface, a conductive paste being
buried in the second shaped member to form the
internal conductor; and
a step of obtaining a joined member by inserting a portion
of the sintered body into the recessed portion in the
second shaped member and then firing the assembly.

17. The method manufacturing the wafer-use member,
according to claim 16, wherein
in the step of inserting, the relay conductor is inserted into
the first shaped member so that one end of the relay
conductor projects from an upper surface of the first
shaped member,
in the step of preparing the second shaped member, a hole
is formed in the recessed portion, and,
in the step of obtaining the joined member, the one end of
the relay conductor is inserted into the hole.

18. A method of manufacturing a wafer-use member
having an insulating plate-shaped part comprising an upper
surface on which a wafer is to be superimposed and a lower
surface on an opposite side to the upper surface; one or more
internal conductors which are buried in the plate-shaped
part; an insulating columnar part which projects downward
from the lower surface of the plate-shaped part; and a
plurality of relay conductors which respectively comprises
extension portions vertically extending inside the columnar
part and which are electrically connected to the one or more
internal conductors, the method comprising:
a step of preparing a first shaped member including the
columnar part by using a ceramic material;
a step of inserting the relay conductor into the first shaped
member;
a step of obtaining a first sintered body by firing the first
shaped member in which the relay conductor was
inserted;

a step of preparing a second shaped member by using a ceramic material, the second shaped member comprising a shape of the plate-shaped part with a recessed portion in a lower surface, a conductive paste being buried in the second shaped member to form the internal conductor;

a step of obtaining a second sintered body by firing the second shaped member; and a step of obtaining a joined member by inserting a portion of the first sintered body into the recessed portion in the second sintered body and joining the two.

* * * * *